United States Patent
Aizenberg et al.

(10) Patent No.: US 8,927,464 B2
(45) Date of Patent: Jan. 6, 2015

(54) ASSEMBLY AND DEPOSITION OF MATERIALS USING A SUPERHYDROPHOBIC SURFACE STRUCTURE

(75) Inventors: Joanna Aizenberg, Boston, MA (US); Benjamin Hatton, Cambridge, MA (US)

(73) Assignee: President and Fellows of Harvard College, Cambridge, MA (US)

(*) Notice: Subject to any disclaimer, the term of this patent is extended or adjusted under 35 U.S.C. 154(b) by 694 days.

(21) Appl. No.: 12/745,207

(22) PCT Filed: Dec. 1, 2008

(86) PCT No.: PCT/US2008/085146
§ 371 (c)(1),
(2), (4) Date: Nov. 19, 2010

(87) PCT Pub. No.: WO2009/070796
PCT Pub. Date: Jun. 4, 2009

(65) Prior Publication Data
US 2011/0077172 A1    Mar. 31, 2011

Related U.S. Application Data

(60) Provisional application No. 60/991,090, filed on Nov. 29, 2007.

(51) Int. Cl.
| | |
|---|---|
| *C40B 40/06* | (2006.01) |
| *C40B 40/10* | (2006.01) |
| *C40B 50/12* | (2006.01) |
| *B05D 5/12* | (2006.01) |
| *B05D 5/00* | (2006.01) |
| *B01J 8/02* | (2006.01) |
| *B01J 35/02* | (2006.01) |
| *B81C 1/00* | (2006.01) |

(52) U.S. Cl.
CPC ................ *B81C 1/00206* (2013.01)
USPC ............... 506/16; 506/18; 506/29; 427/100; 427/130; 427/256; 422/211

(58) Field of Classification Search
CPC ........ C40B 40/06; C40B 40/10; C40B 50/12; B05D 5/12; B05D 5/00; B01J 8/02; B01J 35/02
USPC ............... 506/16, 18, 29; 427/100, 130, 256; 422/211
See application file for complete search history.

(56) References Cited

U.S. PATENT DOCUMENTS 6,185,961 B1 * 2/2001 Tonucci et al. ............... 65/60.4
8,084,116 B2 * 12/2011 Aizenberg et al. ............ 428/119
(Continued)

FOREIGN PATENT DOCUMENTS

WO    WO 2005021843 A1 *  3/2005
WO    WO-2009/070796       6/2009

OTHER PUBLICATIONS

Wu et al., (J Phys Chem B. Jun. 2006;110:11247-11252).*

(Continued)

*Primary Examiner* — Cherie M Stanfield
(74) *Attorney, Agent, or Firm* — Wilmer Cutler Pickering Hale and Dorr LLP

(57) ABSTRACT

Fluidics-induced localized deposition and assembly of materials using a superhydrophobic surface structure is described. A method of localized deposition of a material includes contacting a superhydrophobic substrate comprising raised surface structures with a non-wetting fluid comprising a material to be locally deposited or a precursor thereto, said surface and said fluid selected such that the fluid wets only an upper portion of the raised surface structure; and allowing the material to deposit at the tips of the surface structure.

16 Claims, 22 Drawing Sheets

(56) References Cited

U.S. PATENT DOCUMENTS

| | | |
|---|---|---|
| 2004/0191127 A1 | 9/2004 | Kornblit et al. |
| 2005/0038498 A1* | 2/2005 | Dubrow et al. ............... 623/1.15 |
| 2005/0181195 A1* | 8/2005 | Dubrow ..................... 428/297.4 |
| 2005/0269743 A1* | 12/2005 | Kroupenkine et al. ........ 264/291 |
| 2006/0108097 A1 | 5/2006 | Hodes et al. |
| 2007/0077396 A1* | 4/2007 | Aizenberg et al. ............. 428/172 |
| 2007/0166464 A1 | 7/2007 | Acatay et al. |
| 2007/0166513 A1* | 7/2007 | Sheng et al. ................... 428/141 |
| 2007/0225800 A1* | 9/2007 | Sahatjian et al. ............. 623/1.42 |
| 2007/0282247 A1* | 12/2007 | Desai et al. ..................... 604/19 |
| 2009/0009572 A1 | 1/2009 | Li et al. |

OTHER PUBLICATIONS

Nystrom et al., (Chem Commun. Jul. 26, 2006:3594-3596).*
Aizenberg et al., (Phys Rev Lett. Mar. 27, 2000;84(13):2997-3000).*
Aizenberg et al., (Science. 2003;299,1205-8).*
Ahuja, et al., "Nanonails: A Simple Geometrical Approach to Electrically Tunable Superlyophobic Surfaces," Langmuir, 2008, vol. 24, No. 1, pp. 9-14.
Aizenberg, et al., "Patterned Colloidal Deposition Controlled by Electrostatic and Capillary Forces," Physical Review Letters, vol. 84, No. 13, Mar. 2000, pp. 2997-3000.
Author Unknown, Nanogenerators Convert Mechanical Energy to Electricity for Self-Powered Devices, ScienceDaily, Apr. 2006, 3 pages.
Barthlott, et al., "Purity of the Sacred Lotus, or Escape from Contamination of Biological Surfaces," Planta, 1997, 202, pp. 1-8.
Berger, "Acoustic Sensors Made from Magnetic Nanowires," Jun. 13, 2006, Nano Werk, Retrieved from ww.nanowerk.com/spotlight/spotid-560.php. 2 pages.
Cassie et al., "Wettability of Porous Surfaces," Trans. Farad. Soc., vol. 40, pp. 546-551, Jun. 1944.
Ge et al., "One-Step Preparation of *Polystyrene* Colloidal Crystal Films with Structural Colors and High Hydrophobicity," Thin Solid Films, 515, 2006, pp. 1539-1543.
Hatton, et al., "Localized Deposition on a Superhydrophbic Nanowire Array," Abstract disclosed at a Conference in Nov. 2007, 1 page.
Johnson, "Nanogenerator Takes Charge from Motion," EETimes News & Analysis, May 2006, 1 page.
Kim, et al., "Nanostructured Surfaces for Dramatic Reduction of Flow Resistance in Droplet-Based Microfluidics," Technical Digest, Fifteenth IEEE International Conference on Micro Electroc Mechanical Systems, Feb. 2002, pp. 479-482.
Krupenkin, et al., "From Rolling Ball to Complete Wetting: The Dynamic Tuning of Liquids on Nanostructured Surfaces," Langmuir, 2004, vol. 20, No. 10, pp. 3824-3827.
Lau et al., "Superhydrophobic Carbon Nanotube Forests," Nano Letters, 2003, vol. 3, No. 12, pp. 1701-1705.
McAuley, et al., "Silicon Micromachining Using a High-Density Plasma Source," Journal of Physics D: Applied Physics, 34, 2001, pp. 2769-2774.
McGary, et al., "Magnetic Nanowires for Acoustic Sensors (invited)," Journal of Applied Physics, 99, 08B310, 2006, pp. 08B310-1-08B310-6.
Notsu, et al., "Super-hydrophobic/super-hydrophilic patterning of gold surfaces by photocatalytic lithography," J. Mater. Chem., 2005, 15, pp. 1523-1527.
Wang, et al., "Piezoelectric Nanogenerators Based on Zinc Oxide Nanowire Arrays," Science, vol. 312, Apr. 2006, pp. 242-246.
Wenzel, "Resistance of Solid Surfaces to Wetting by Water," Industrial and Engineering Chemistry, Aug. 1936, vol. 28, No. 8, pp. 988-994.
Zhao, et al., "Self-Organized Polymer Aggregates with a Biomimetic Hierarchical Structure and its Superhydrophobic Effect," Cell Biochem. Biophys, 2007, 49, pp. 91-97.

* cited by examiner

ASSEMBLY AND DEPOSITION OF MATERIALS USING A SUPERHYDROPHOBIC SURFACE STRUCTURE

CROSS-REFERENCE TO RELATED APPLICATIONS

The application is the national phase application International Patent Application No. PCT/US2008/85146, filed on Dec. 1, 2008, which claims the benefit of the filing date of U.S. Patent Application No. 60/991,090, filed on Nov. 29, 2007, the content of which are hereby incorporated by reference herein in their entirety.

COPYRIGHT NOTICE

This patent disclosure may contain material that is subject to copyright protection. The copyright owner has no objection to the facsimile reproduction by anyone of the patent document or the patent disclosure as it appears in the U.S. Patent and Trademark Office patent file or records, but otherwise reserves any and all copyright rights.

INCORPORATION BY REFERENCE

All patents, patent applications and publications cited herein are hereby incorporated by reference in their entirety in order to more fully describe the state of the art as known to those skilled therein as of the date of the invention described herein.

BACKGROUND

Surface functionalization is an important capability in materials science, bioengineering, and semiconductor technology. Localized and controlled deposition of materials from solution provides a means to control various aspects of a nanostructure, such as location, pattern, or morphology. New methods for the control of nucleation, growth, deposition, and/or assembly of materials are desired.

SUMMARY

The use of a superhydrophobic surface to direct the growth or deposition of materials is described.

In one aspect, a superhydrophobic surface structure is a template for fluidics-induced localized nucleation, growth and/or assembly of materials. A superhydrophobic surface (which could be any superhydrophobic surface) can be subjected to solution-based chemistry near the raised surface structure with a fluid. In certain embodiments, the solution-based chemistry includes precipitation reactions, but, other processes are also possible, such as molecular adsorption, colloidal deposition, polymerization, catalytic reactions and the deposition of biological cells.

In one embodiment, solid precipitates are grown from solution by heterogeneous nucleation onto the exposed raised surface structures of a superhydrophobic surface, such as an array of wires, posts, or protrusions.

In one aspect, a method of localized formation of a material includes contacting a superhydrophobic substrate comprising raised surface structures with a non-wetting fluid comprising a material to be locally formed on the raised surface structure or a precursor thereto, where the superhydrophobic surface and the fluid are selected such that the fluid wets only an upper portion of the raised surface structure; and causing the material to form on the raised surface structure.

In one or more embodiments, the raised surface structure comprises micro-scale or nano-scale posts or rods, or the superhydrophobic surface can comprise a plurality of nanowires or carbon nanotubes, or the superhydrophobic surface can comprise an array of silicon posts, or the superhydrophobic surface can comprise a random array of isolated or interconnected raised surface structures.

In one or more embodiments, the raised surface structure is chemically treated to include a hydrophobic layer.

In one or more embodiments, the raised surface structure is treated to provide bonding or adherent interaction of the deposited material and the raised surface.

In one or more embodiments, the method further includes removing the adherent deposited materials and the raised surface structures from the substrate.

In one or more embodiments, the material comprises molecules, polymers, colloidal particles, biological cells, or mixtures thereof. In some embodiments, the material is catalytic, magnetic, optically-active, piezoelectric or bioactive.

In one or more embodiments, the method further includes moving the non-wetting fluid across the raised surface structure. In certain embodiments, the deposited material detaches from the raised surface structure as the fluid moves across the raised surface structure. In some other embodiments, the deposited material includes molecules that form a fiber or network of fibers across the raised surface structure.

In another aspect, a method of localized formation of a material includes providing a superhydrophobic substrate comprising a raised surface structure, said raised surface structure comprising at least two regions having different surface properties; contacting the surface with a fluid, said liquid comprising a material to be locally formed on the raised surface structure or a precursor thereto, wherein the surface properties of the two or more surface regions and the fluid are selected such that the fluid wets one or the other or both of the at least two regions of the surface structure; and causing the material to deposit at one or the other or both of the at least two regions of the raised surface structure.

In one or more embodiments, the fluid selectively deposits a material at one of the at least two regions of the raised surface structure.

In one or more embodiments, the fluid selectively deposits at a region located a distance from the tip of the raised surface structure.

In one or more embodiments, the method further includes contacting the deposited raised surface structure with a second fluid, said second fluid comprising a second material to be locally deposited or a precursor thereto, wherein the material is deposited over both the first and second regions of the raised surface structure.

In another aspect, a structure includes a substrate; a plurality of raised surface structures on the surface of the substrate, said raised surface structures of a composition and a morphology to provide a superhydrophobic surface; and a material adherent to an upper portion of the raised surface structures.

In one or more embodiments, the raised surface structure comprises nano-scale posts or rods, or the superhydrophobic surface comprises a plurality of nanowires or carbon nanotubes, or the superhydrophobic surface comprises an array of silicon or polymeric posts, or the superhydrophobic surface comprises a random array of raised surface structures. In one or more embodiments, the raised surface structure is chemically treated to include a hydrophobic layer, or the raised surface structure is treated to provide bonding or adherent interaction of the adherent material and the raised surface structure.

In one or more embodiments, the adherent material is catalytic, magnetic, piezoelectric or bioactive. In other embodiments, the adherent material comprises organic or inorganic precipitates, molecules, polymers, colloidal particles, biological cells, or mixtures thereof.

In one or more embodiments, the adherent material is adherent to an uppermost portion of the raised surface structures.

In one or more embodiments, the raised surface structures comprise at least two regions having different surface properties, and the adherent material is adherent to at least one of said two regions.

In one or more embodiments, two or more adherent particles cluster together.

In one or more embodiments, the adherent material comprises a molecule that forms a fiber across the raised surface structure.

BRIEF DESCRIPTION OF THE DRAWING

Various objects, features, and advantages of the present invention can be more fully appreciated with reference to the following detailed description of the invention when considered in connection with the following drawings, in which like reference numerals identify like elements. The following drawings are for the purpose of illustration only and are not intended to be limiting of the invention, the scope of which is set forth in the claims that follow.

DETAILED DESCRIPTION

Figure 1A:
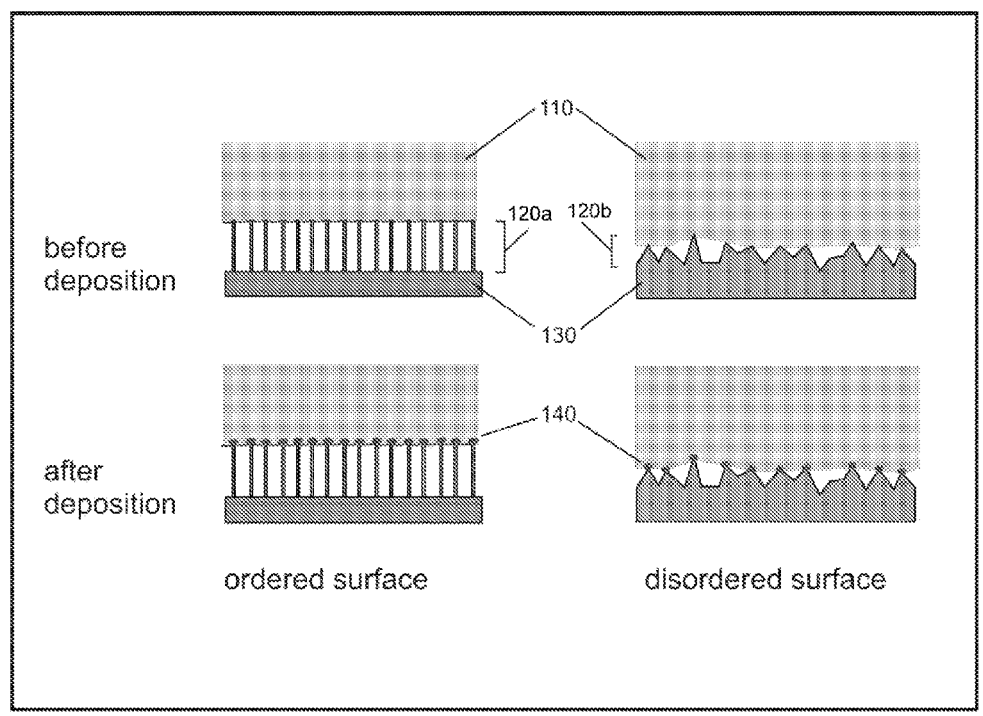
FIG. 1A is a schematic illustration of localized precipitate growth on a superhydrophobic surface structure according to one or more embodiments.

With reference to FIG. 1A, a superhydrophobic surface 120 can be contacted with a fluid 110 containing a material to be locally deposited to obtain high contact angles. In certain embodiments, the superhydrophobic surface can cause contact angles greater than or equal to 140°. Superhydrophobic surfaces can be formed by utilizing materials that tend to reduce wetting of a liquid when in contact with the surface. Superhydrophobic surfaces can further have surface structures that are typically on the order of micrometers or nanometers in at least one dimension. The surface structures can be an ordered or disordered array of protrusions. However, the actual shape, size, and spacing between the protrusions are not critical. Generally, such surfaces will be referred to as "raised surface structures."

Any superhydrophobic surface may be used, including a nanowire array, ordered array of posts, a suitably rough surface, a layer of hydrophobic spheres, lines, and the like. In some embodiments, the superhydrophobic surface can include nanosurface structures that result in a high degree of surface roughness, such as an array of nanorods or nanoposts. A high degree of surface roughness can substantially increase the hydrophobicity of the surface and thereby cause the phenomenon of superhydrophobicity.

The spacing, height and other dimensions of the features on the raised surface structures are matters of discretion. For example, the dimensions of the structures may be on the order of angstroms, nanometers, or microns. In one embodiment, wires are used in which the diameter of the distal ends is about 200 nanometers, the post height is about 8 microns, and the pitch, or channel distance between wires, is about 2 microns.

In other embodiments, the spacing between posts, or pitch, can be much less than micrometers. For example, the spacing can be as low as 100 nm or even a few nanometers. In other embodiments, for example, where the posts will be used to support a catalyst, the pitch may be much greater, for example, 1 mm.

These structures can be fabricated from, for example, silicon, silicon dioxide, other inorganic glasses, or an organic polymer. Exemplary superhydrophobic surfaces can include arrays of organic or inorganic nanoposts, such as Si nanoposts that are etched into the surface of a silicon wafer. Other examples of superhydrophobic surfaces include a hydrophobic array of carbon nanotubes, rough surfaces produced by etching, rough polymer surfaces, and arrays of colloidal particles.

Other exemplary superhydrophobic surfaces can include arrays of organic or inorganic nanoposts, such as Si nanoposts that are etched into the surface of a silicon wafer and coated with a hydrophobic surface layer. Exemplary hydrophobic materials include fluorinated polymers, e.g., PTFE and hydrophobic silanes. Inorganic and polymer surfaces can be treated to enhance hydrophobic properties of the surface. For example, a low surface energy material can be deposited on the raised surface structures to increase the hydrophobic nature of the features.

In certain embodiments, the shape of the nanoposts can provide greater flexibility in obtaining the desired superhydrophobic surfaces. As one particular non-limiting illustrative example of superhydrophobic surfaces, "nail-shaped" posts (see, e.g., FIG. 8A), which have a kind of re-entrant structure, can be utilized. Such "nail-shaped" posts may sustain superhydrophobic non-wetting even for liquids that have a relatively low surface contact angle, such as angles between 40° and 90°. Background information on such nail-shaped posts can be found in Ahuja, A.; Taylor, A.; Lifton, V.; Sidorenko, A.; Salamon, T. R.; Lobaton, E. J.; Kolodner, P.; Krupenkin, T., Nanonails: A Simple Geometrical Approach to Electrically Tunable Superlyophobic Surfaces. *Langmuir* 2008, 24, 9-14, the contents of which is incorporated by reference herein in its entirety.

For surfaces having contact angles greater than about 110°, the "Cassie model" of hydrophobicity and surface roughness can be particularly useful. The Cassie model assumes that air is trapped below a drop of aqueous liquid sitting on the exemplary rough structure shown in FIG. 1A, such that the liquid sits on a composite surface. See, for background information, "Wettability of Porous Surfaces", A. B. D. Cassie et al., *Trans. Farad. Soc.*, Vol. 40, pp. 546-551 (1944).

For contact angles within a range of between slightly greater than about 90° up to about 110°, the "Wenzel model" of hydrophobicity and surface roughness is particularly useful. The Wenzel model regards surface area as being proportional to surface roughness. See, for background information, Wenzel, R. N., "Resistance of Solid Surfaces to Wetting by Water" *Ind. Eng. Chem.*, Vol. 28, pp. 988-994 (1936).

Background information on rough structures and their preparation is provided in Kim, Joonwon et al., *Rough structured Surfaces for Dramatic Reduction of Flow Resistance in Droplet-Based Microliquidics*, Technical Digest, Fifteenth IEEE International Conference on Micro Electro Mechanical Systems, February 2002, pp. 479-482.

Further background information regarding contact angle modification in rough structured surfaces is provided in Kim, Joonwon et al., "Nanostructured Surfaces for Dramatic Reduction of Flow Resistance in Droplet-Based Microliquidics", *Technical Digest, Fifteenth IEEE International Conference on Micro Electro Mechanical Systems*, pp. 479-482 (February 2002)."

Figure 1B:
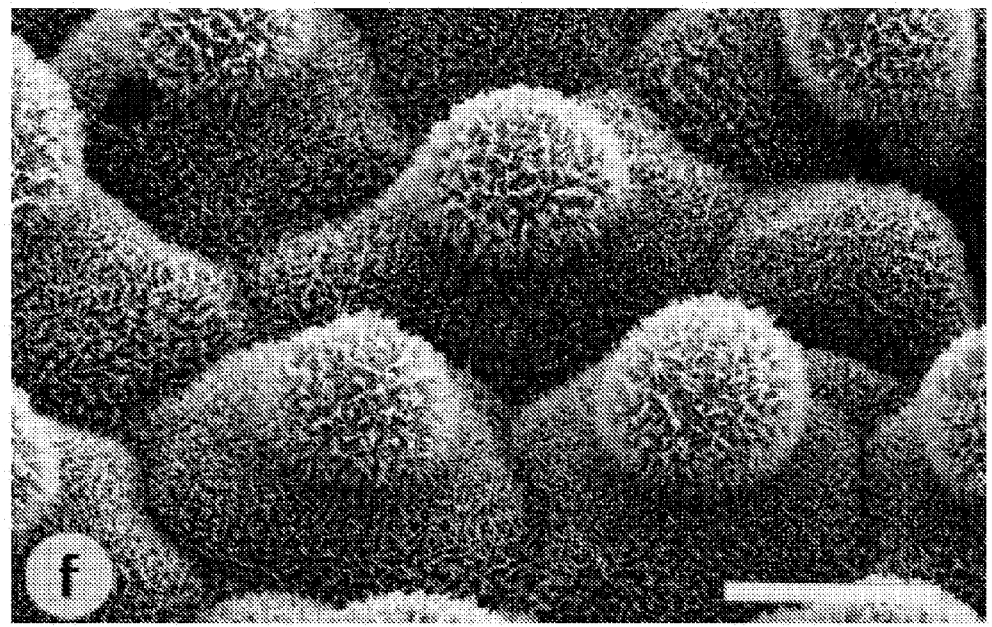
FIGS. 1B through 1E are illustrative examples of the various structures that can have superhydrophobic surfaces.
Figure 1C:
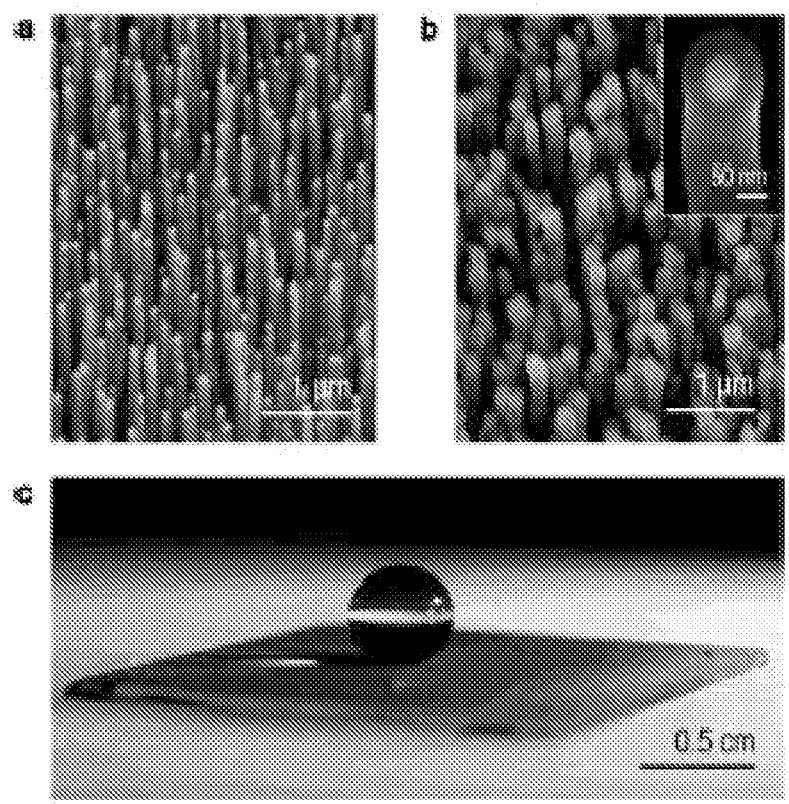
Figure 1D:
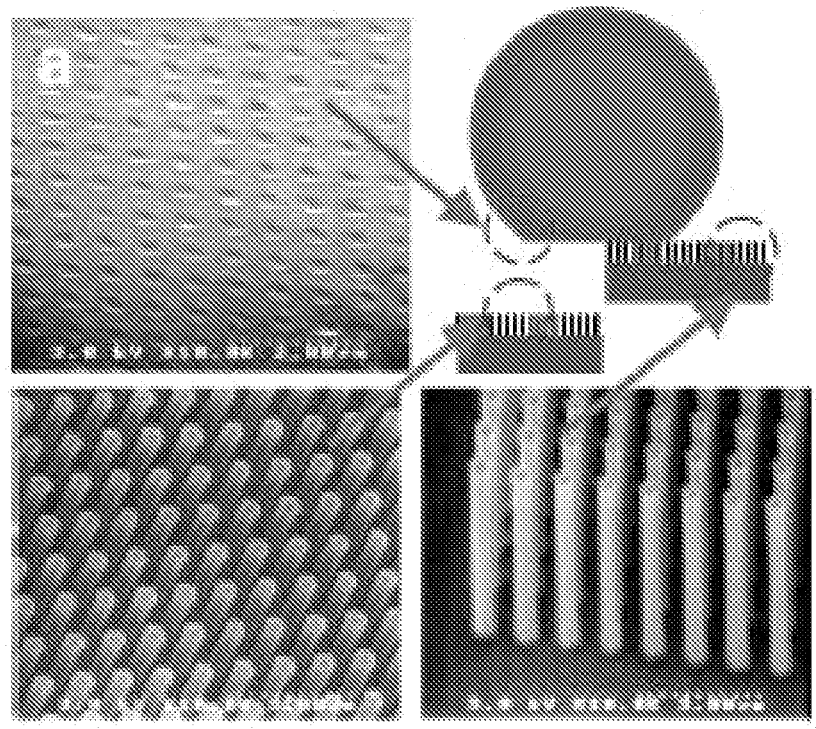
Figure 1E:
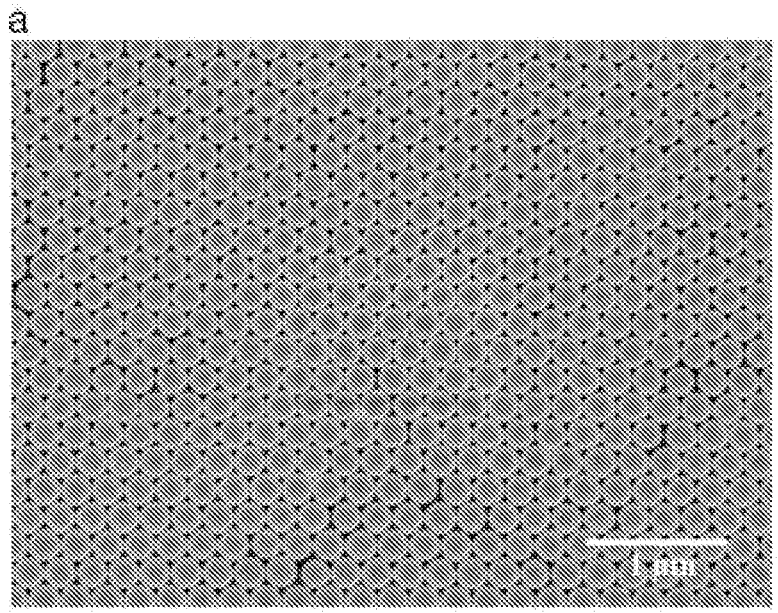

Further examples of superhydrophobic surfaces include structures from nature, e.g., the lotus leaf (see FIG. 1B) (Barthlott and Neinhuis, Planta 1997); an array of carbon nanotubes on a surface (see FIG. 1C) (Lau et al, Nano Letters 2003); an array of high aspect ratio posts etched in a Si wafer (see FIG. 1D) (Krupenkin et al Langmuir 2004); and an array of polystyrene spheres (see FIG. 1E) (Ge et al, Thin Solid Films 2006), the contents of which are incorporated in their entirety by reference.

For convenience, all of these structures including those having dimensions in nanometers, angstroms, microns, or larger are collectively referred to herein as "raised surface structures".

Functionalization of Superhydrophobic Surface

Superhydrophobic surfaces include those that can be functionalized by any suitable and/or desirable means. For example, the desired regions near the tips of the superhydrophobic surface can be functionalized with any desired groups, such as groups that are capable of electrostatic, covalent, hydrogen bonding, and/or van der Waals interactions. In one embodiment, surface structures having a re-entrant (ie; nail-head) structure can be functionalized with surface groups such that aqueous liquids will remain superhydrophobic.

In certain embodiments, the raised surface structures of the superhydrophobic surface can be functionalized in a variety of ways to provide a surface for precipitation, absorption or deposition of material from solution to occur. In one embodiment, a raised surface structure can be treated to deposit a layer of gold, which can then be reacted with a variety of materials, e.g., hydrophobic thiol compound, to form a hydrophobic surface. Exemplary thiolated molecules include poly (styrene-co-2,3,4,5,6-pentafluorostyrene-SH), poly(methyl methacrylate-co-pentafluorooctyl methacrylate-SH), but in general any fluorinated or methylated thiol can be utilized. The tips of the raised surface structure can be further selectively functionalized by contacting the thiol-treated surface with a solution that contains another compound having the desired surface properties. Some exemplary molecules include carboxylic acid-terminated thiols, sulfonated thiol molecules, hydroxyl-terminated thiols, PEG-terminated thiols, and the like.

In another embodiment, a hydrophobic layer can be deposited on the surface of the raised surface structure. For example, if the structure is made of silicon, then the surface can be functionalized with a fluorinated silane. The tips of the raised surface structure can be further selectively functionalized by contacting the hydrophobic surface with a solution that contains an active component (e.g., a functional group capable of further reaction with another material). By controlling the superhydrophobic character of the surface and/or the fluid, the fluid can wet only desired regions of the tips and selectively functionalize the exposed tips of the surface. Exemplary molecules include carboxylic acid terminated silanes, sulfonated silanes, hydroxyl-terminated silanes, PEG-terminated silanes.

The raised surface structures can be also functionalized using a microcontact printing approach, by applying a stamp to the tips of the nanostructured surface.

In another embodiment, the raised surface structures can be functionalized using stepwise fabrication techniques. By way of example, the spaces between structures can be filled with a sacrificial material, which can then be selectively removed to expose the distal ends of the structure. The exposed ends can be functionalized, for example, using any of the methods and solutions described above, and the remaining sacrificial material can be removed. The remainder of the superhydrophobic surface can be treated to apply a hydrophobic coating.

In some embodiments, the superhydrophobic surface can be selectively functionalized at any region along a dimension, e.g., the length, of the raised surface structure. For example, by controlling the interaction of the fluid to the superhydrophobic surface, a first fluid that contacts the tips of the superhydrophobic surface can be introduced. The first fluid can contain desired materials which can adhere to the superhydrophobic surface and provide desired first functional groups. A second fluid which penetrates deeper than the first fluid into the superhydrophobic surface can be introduced to the superhydrophobic surface. The second fluid can contain desired materials which can adhere below the first functional group and provide desired second functional groups. A third fluid which penetrates even deeper than the second fluid into the superhydrophobic surface can be introduced to the superhydrophobic surface. The third fluid can contain desired materials which can adhere below the second functional group and provide desired third functional groups. What may result is a superhydrophobic surface having three different functionalities $R_1$, $R_2$, and $R_3$ near the tip of the superhydrophobic surface (see FIG. 2). This process can be repeated as desired to provide any number of desired functional groups near the tip of the superhydrophobic surface.

Figure 2:
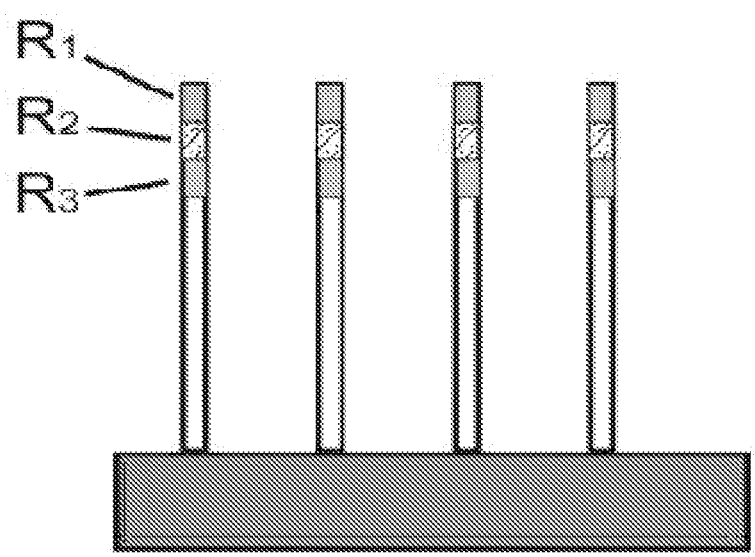
FIG. 2 is a schematic illustration of the selective surface functionalization of nanoposts, using one or more functional groups (R), into bands.

As an alternative embodiment to achieve the linear sequence of deposition of different materials shown in FIG. 2, an array of nanowires can be first covered completely with a layer of sacrificial material (e.g., polymer). Then the polymer layer can be etched away to reveal the tips of the posts that are then functionalized as described above (either using the layer of gold which is then functionalized with a thiol or, in case of Si structures, using the appropriate silane solution). The polymer layer can then be partially etched further to reveal the next band on the wire, which is functionalized as described above. The process can be repeated to produce the desired number of functionalized bands. At the end, the remaining layer of the sacrificial material can be etched and the bottom of the nanowires can be rendered hydrophobic. Suitable polymers may be chosen from those known in the art that are susceptible to etching, such as, photoresist or polystyrene.

Applications

A wide range of materials can be locally deposited and grown by exposing the raised surface structures to a liquid. For example, a suitable liquid can include a range of organic and inorganic compounds that can be deposited from solution. The solution can be aqueous, non-aqueous, or metallic. The raised surface structure tips can serve as a deposition and/or a growth site. For example, the raised surface structures can serve as nucleation sites for deposition, as a heterogeneous catalyst for the nucleation and precipitation of the material, or as an adsorption site for the adsorption of molecules on a surface. In other embodiments, the fluid can contain a colloidal suspension of particles or biological cells that can be deposited on the wetted surfaces of the structured surface, through covalent or non-covalent attachment. In still other embodiments, the solution can include a precursor to the deposited material that reacts to form a product that nucleates and is deposited on the exposed surfaces of the raised surface structure. For example, the solution can contain a monomer, which is polymerized in the fluid and which is deposited as a polymer on the exposed surfaces of the raised surface structure or the fluid can contain a component which reacts to a deposit on the exposed surface of the raised surface structures when subjected to a suitable reagent or catalyst. In one or more embodiments, the chemical reaction is the precipitation of a solid, though could simply be a liquid-based reaction.

Materials deposited on the localized tips of the superhydrophobic surface can contain functional, fluorescent or electroluminescent materials for imaging or display applications, bioactive polymers or molecules for biosensing applications or magnetic materials for actuation in a magnetic field.

A variety of useful materials can be grown from solution onto the tips of (superhydrophobic) raised surface structures, to create new structures with chemical or physical functionality. For example, a bioactive or catalytic compound could be grown on the tips of patterned nanowires, providing an array of catalytic or bioactive dots, e.g., quantum dots. The compound could be ferromagnetic or piezoelectric, for the mechanical actuation and control of physical properties, such as by magnetostriction. The superhydrophobic surface can further be utilized as sensors (e.g., biochip sensor, etc.), where the mechanical resonant frequency of the raise surface structures can be monitored to determine the deposition of materials (e.g., DNA, toxins, bacteria, and the like) onto the raised surface structures.

A similar phenomenon occurs when a hydrophobic droplet comes into contact with a superhydrophilic surface; this phenomenon can also be exploited for localized nucleation and growth of materials, as described herein.

The deposited material can be adherent and, as such, can serve as a substrate for further processes, including cell adhesion, protein adsorption, as sensor and detection arrays, as photonic structures, as an actuation array, for the deposition of a secondary material to produce composite structures; or can be removed to collect uniform colloidal precipitates with controlled shapes and sizes.

The following non-limiting exemplary applications will make apparent to one of ordinary skill in the art numerous other applications that can be envisioned with the superhydrophobic surfaces of the present invention.

Precipitate Nucleation

Useful embodiments of this novel growth procedure are provided. In some embodiments, the precipitate or deposited growths are designed to remain adherent to the tips of the surface structure. In some embodiments, the method is used to provide adherent deposition and growth of material on the raised surface structures. The method can be used to incorporate useful materials onto a nanowire, such as magnetic materials, piezoelectric materials or materials with photonic properties that could alter the refractive indices of the nanowires.

Referring to FIG. 1A, the superhydrophobic surface can be, for example, nanoposts 120a vertically-aligned on a substrate 130. The superhydrophobic surface can be, for another example, rough disordered protrusions 120b from a substrate 130. A fluid 110 can be supersaturated with a soluble form of the material to be deposited or a precursor thereof, or a suspension of colloidal particles or cells. By "fluid" is meant a composition comprising a liquid phase in any desired form, such as a solution, suspension, dispersion, or emulsion, for example. The fluid is ready to produce some kind of materials growth or deposition (i.e.; through a temperature- or evaporation-induced solubility change, an insoluble reaction product, the addition of a common ion, or a 'bad' solvent, polymerization, addition of reactive agents to liquid, exposing liquid to gas or vapor reagents that induce precipitation, reaction to an insoluble product, and the like). The fluid 110, e.g., water, can be in contact in limited regions of the surface, where the superhydrophobic surface can interact with the fluid in a manner to minimize surface contact. Accordingly, the exposed tips 140 can provide sites for nucleation/deposition of desired material. The point contacts of the surface with the fluid can act as a nucleation site and/or a site for other chemical processes that is involved in the deposition process. For example, if the conditions are suitable for heterogeneous nucleation, then precipitation can occur in a controlled, localized manner only on those exposed tips. The superhydrophobic structure could further be chemically functionalized, to influence the precipitate growth. For example, the superhydrophobic surface can be treated to increase its hydrophobicity, to increase adherent interactions, e.g., covalent or ionic interactions, with the deposited material and/or to direct deposition to occur at selected locations and/or in a selected order. In some embodiments, if the (non-wetting) droplet is removed, these localized precipitates can remain on the substrate surface.

Figure 3:
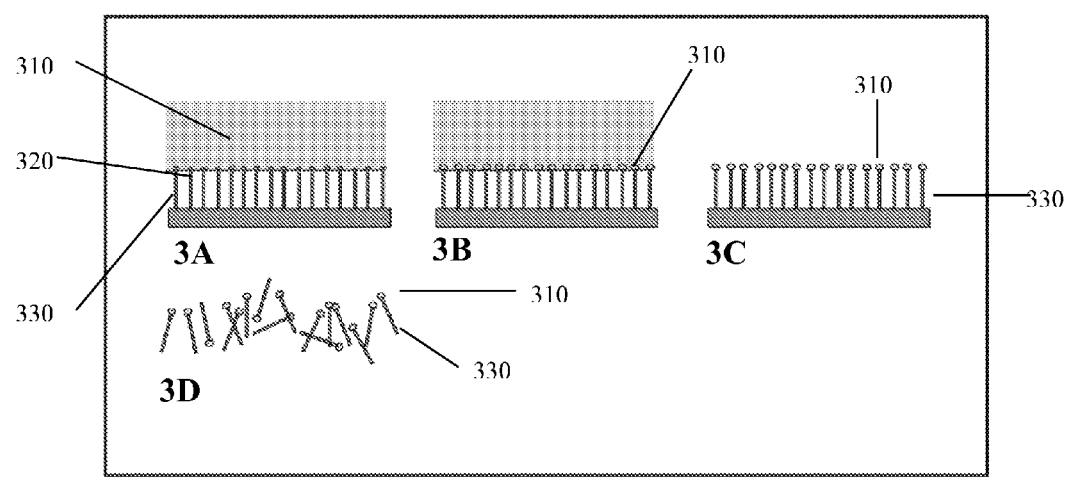
FIG. 3 is a schematic illustration of a method for adherent growth of precipitates on the tips of raised surface structures according to one or more embodiments in which (A) precipitates nucleate on the tips of raised surface structures, (B) the precipitates grow to a controllable size, (C) the fluid is removed to provide an array of precipitated growths on the tips of the raised surface structures and (D) optionally, the functionalized raised surface structures are removed from the substrate to provide functionalized nanorod heterostructures.

FIG. 3 provides a schematic illustration of a method for precipitate nucleation on the tips of raised surface structures such as rods or posts. In FIG. 3A, nucleation can begin from a supersaturated solution 310 that contacts the exposed upper portion 320 of the nanorods 330. Over time, the adherent growth of precipitates 310 can increase the size of the deposited material on the nanorod tips; however, the localized precipitate deposits can remain on the posts of a superhydrophobic surface, both during growth (FIG. 3B) and following removal of the growth solution (FIG. 3C). One exemplary way that such adherent growth can be achieved is by the chemical functionalization of the tips of the superhydrophobic surface with functional groups that provide strong bonding/interaction with the deposited material. Functional groups can improve adherence by a variety of methods, including electrostatic, van der Waals, hydrogen bonding, and/or covalent forces. The functionalized nanorods with adherent deposited material can remain on the surface or they can be released from the substrate to provide functionalized nanorods with asymmetric properties, as show in FIG. 3D.

Figure 4:
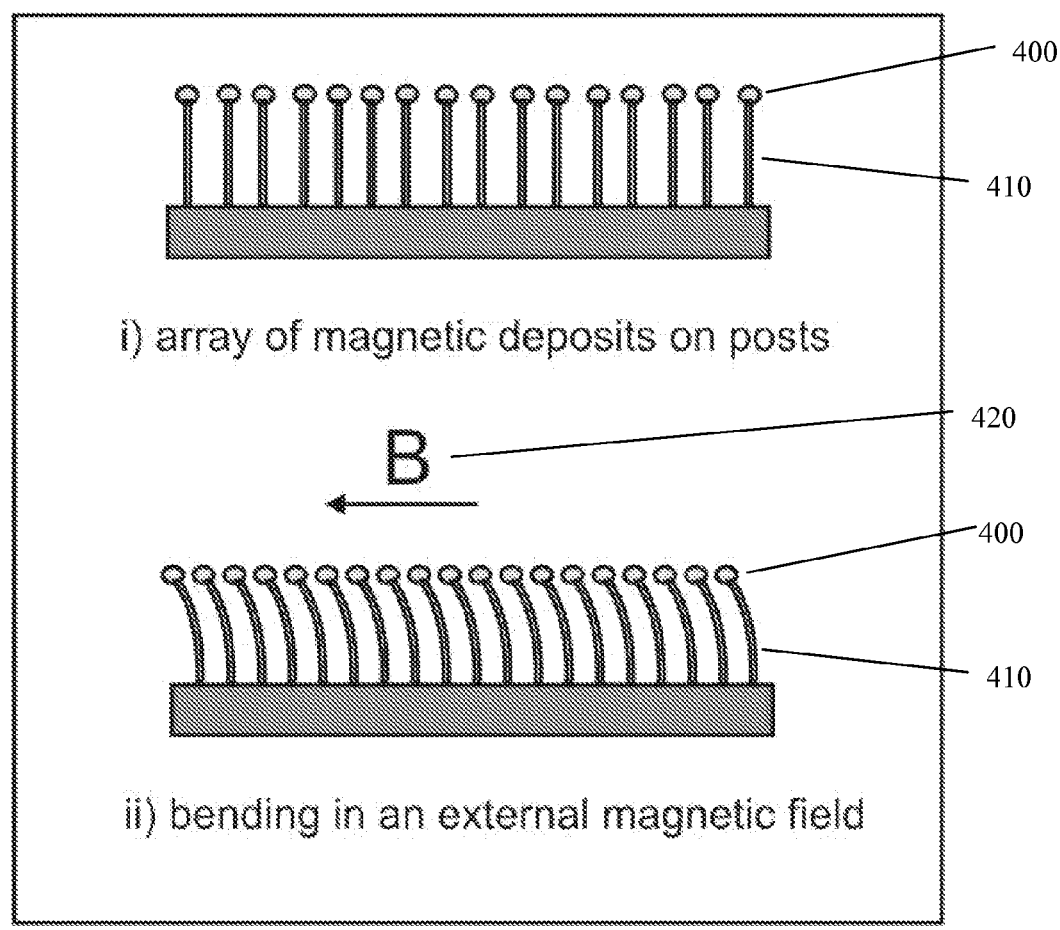
FIG. 4 is a schematic illustration of (i) a nanowire array having an adherent deposition of a ferromagnetic material on the tips of the posts and (ii) magnetostrictive behavior of the ferromagnetic material-functionalized posts, which cause the posts to bend in an applied magnetic field.

Many different applications utilizing the structure formed in FIG. 3C can be envisioned. For example, FIG. 4 is a schematic illustration of a functionalized array according to one or more embodiments. Localized nucleation and growth of an adherent particle can be used to deposit a material 400 that is, for example, piezoelectric, ferromagnetic or magnetic, on a nanowire 410. On application of a magnetic field B (designated by arrow 420) (or an electric field if the material is piezoelectric), the magnetically functionalized nanowires can be deflected in a magnetic field to form a microswitch or to turn a function in a microdevice on or off. Following adherent growth, these functionalized nanowires could potentially also be removed from the substrate, as discussed above, for biological sensing applications, or to make highly asymmetric structural units for self-assembly. Exemplary magnetic materials for deposition can include Fe, Ni, Co, Gd, $Ni_3Fe$, CoFe, $Fe_3O_4$, $Fe_2O_3$, $FeTiO_2$, $Fe_2TiO_2$, $NiFe_2O_4$, $MgFe_2O_4$, $Fe_7S_8$, $Fe_3S_4$, FeS, alloys thereof, and mixtures thereof.

As another non-limiting example of different applications that can be envisioned, adherent deposition of materials can occur at different locations on the superhydrophobic raised surface structures in coordination with the location and nature of the chemical functionality on the structure and the position of the liquid interface. Chemical functionality can be used to control the location of the liquid interface. The selective surface functionalization of the nanopost makes it possible to control the adherent deposition of materials at different locations, or to make a composite or gradient of materials growth.

Figure 5:
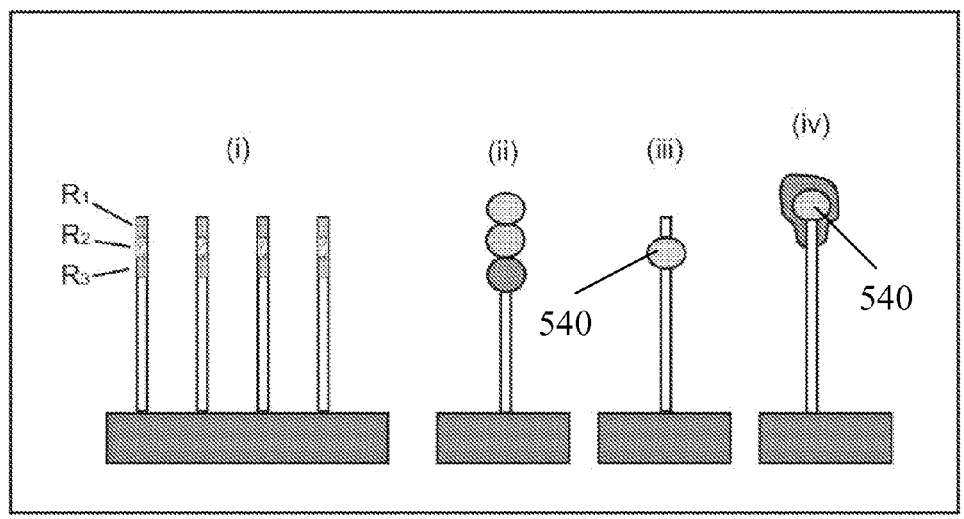
FIG. 5 is a schematic illustration of the selective surface functionalization of nanoposts, using one or more functional groups (R), into bands (i). As a result of this functionalization, precipitate growth can be achieved as a linear sequence of different materials (ii), at selective locations (iii), or as a composite growth (iv) on the nanoposts.

For example, a superhydrophobic surface formed using nanowire can be functionalized with one or more functional groups, R (see FIG. 5(i)). As noted above, functional groups can change the surface properties of the tip of the nanowire relative to the rest of the nanowire, and can, for example, improve the adherent properties of the functionalized region. In some embodiments, the nanowire or nanopost can be selectively surface functionalized using two or more functional groups (R), into bands as is illustrated in FIG. 5(i). In FIG. 5(i), nanowires are shown having a first functionalization layer having functional group $R_1$, a second functionalization layer having functional group $R_2$, and a third functionalization layer having functional group $R_3$, in stacked relationship to one another. As a result of this functionalization, precipitate growth can be achieved as a linear sequence of different materials on the nanoposts as shown in FIG. 5(ii), at selective locations on the nanoposts as shown in FIG. 5(iii), or as a composite growth on the nanoposts as shown in FIG. 5(iv).

To achieve the multiple deposition of materials as shown in FIG. 5(ii), a solution can be provided that contains several components, each of which selectively deposits on a region $R_1$, $R_2$ or $R_3$ of the nanopost. Alternatively, the materials can be deposited by expositing the composite nanopost to a series of solutions, each of which is selected to deposit a specific compound at a specific location. The subsequently deposited materials do not deposit on top of the previously deposited material(s).

The selective deposition on the nanopost as illustrated in FIG. 5(iii) can be used to selectively deposit material at a location that is recessed from the tip of the nanopost. In the embodiment exemplified, the second region $R_2$ is functionalized to favorably interact with solution, so that the fluid extends further into the raised surface structures than it would absent the $R_2$ functionalized layer. Layer $R_2$ can act as a nucleation catalyst for the solution and deposits a material layer selectively around the available $R_2$ surfaces.

The composite deposition shown in FIG. 5(iv) can be achieved by carrying out the deposition method described above, and then exposing a second solution to the nanoposts. The second solution can wet the surface of the previously nucleated material 540 as well as the $R_2$ surface and the second solution can nucleate and deposit a both surfaces $R_1$ and 540.

Writing A Pattern of Adherent Particles Onto a Superhydrophobic Surface

Figure 6:
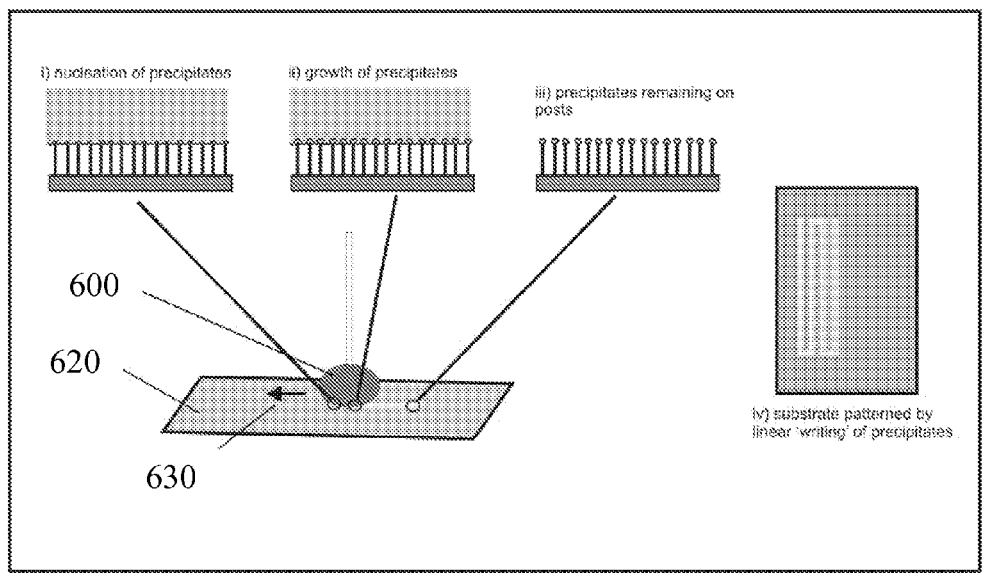
FIG. 6 is a schematic illustration of adherent growth of a deposited material from a linearly translated droplet according to one or more embodiments.

Other embodiments for utilizing the superhydrophobic surface is shown schematically in FIG. 6. A non-wetting droplet of a growth solution, e.g., supersaturated solution of the compound to be deposited or a precursor thereto, can be fed by a syringe, pipette, syringe pump or other delivery device and can be linearly translated across a superhydrophobic surface, in a dynamic growth process referred to as 'precipitate writing'. As a result, a pattern of localized precipitate deposits, molecules or colloidal particles can be produced on a substrate, in a continuous process.

With reference to FIG. 6, in a continuous precipitate writing process, a droplet 600 of a supersaturated solution can be generated at the tip of a dispensing device, such as syringe. The syringe can be drawn over the surface of a superhydrophobic substrate 620 along the direction indicated by arrow 630. The dispensing device can be in communication with a reservoir of growth solution and so can continually replenish the growth solution as deposition is on-going.

At the leading contact edge (illustrated in inset FIG. 6(i)), the solution can contact the tips of the superhydrophobic surface structure (i.e.; nanowires) and nucleation can be initiated. As the droplet of solution is drawn over the substrate, additional material can be deposited from solution and the precipitates can grow. Inset FIG. 6(ii) shows the deposition process within the droplet. If the material, structure and growth conditions are such that the growth is adherent, the deposited materials can remain on the substrate as the droplet continues to traverse the substrate. The deposits can remain on the posts, as is illustrated in inset FIG. 6(iii). As a result, any desired pattern can be written onto the substrate, as is schematically illustrated in FIG. 6(iv).

Continuous Nucleation and Growth Process

In an alternative embodiment, the deposited material need not be adherent to the superhydrophobic surface, so that the droplet picks up the deposited material as the liquid is withdrawn from the surface. This can result in a liquid droplet with an increasing concentration of particles of deposited material.

For example, deposited material can be prepared continuously in a flow reactor, using the superhydrophobic surface as a heterogeneous catalyst for nucleation and growth. In one embodiment, the precipitates are not adherent at some stage of growth (i.e.; lose their adhesion to the exposed tip surface), and the superhydrophobic surface can act as a surface for nucleation in a flow reactor, to cause the precipitation of a reactant, and allow for growth until a critical size is reached for mechanical detachment, due to a weak point of contact with the nanowire.

Figure 7A:
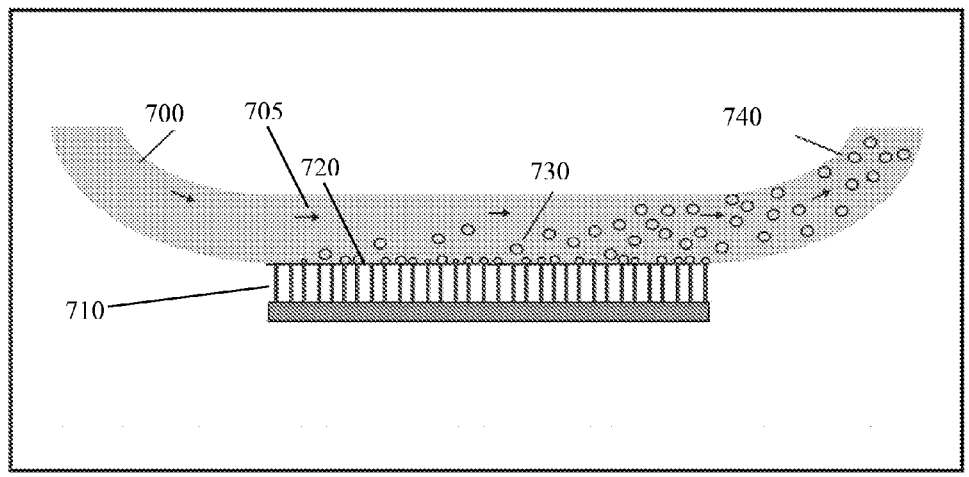
FIG. 7 is a schematic illustration of a nucleation and non-adherent growth process in a droplet.

FIG. 7A shows a schematic of this process. A supersaturated solution 700 can be flowed across the superhydrophobic surface 710 in a direction indicated by arrow 705. In an initial step, nucleation of the compound can occur at the tips of the superhydrophobic surface 720. As the fluid continues to flow over the surface, the nucleated particles can continue to grow in size. When a predetermined size is reached, the particles 730 can detach from the surface, as the fluidic forces become sufficiently large on the growing particle. The size-monodispersed precipitate particles can then be collected as a reaction product as part of a continuous flow process 740. Suitable particle sizes leading to detachable particles can be determined, for example, empirically. The time and conditions for the experiment that can lead to a desired size of the particles and can be determined in control experiments. Thereafter, the procedure can follow the guidelines identified in those control experiments.

In certain embodiments, the shape and morphology of particles can be controlled by the shape of the raised surface structural elements, such as nanoposts. For example, if the posts have a straight shape, with a small diameter (ie; <300 nm), hemispherical particle morphologies can be achieved by extended periods of growth. If the posts have a 'nail-shaped' re-entrant structure, more spherical morphologies can be achieved.

The adhesion of the particle to the post structures can be controlled by the surface chemistry so that adhesion of spherical deposits can be achieved using nail-shaped posts with a surface functionalization (such as —COOH groups) to provide both physical and chemical attachment of the particles to the post.

Figure 7B:
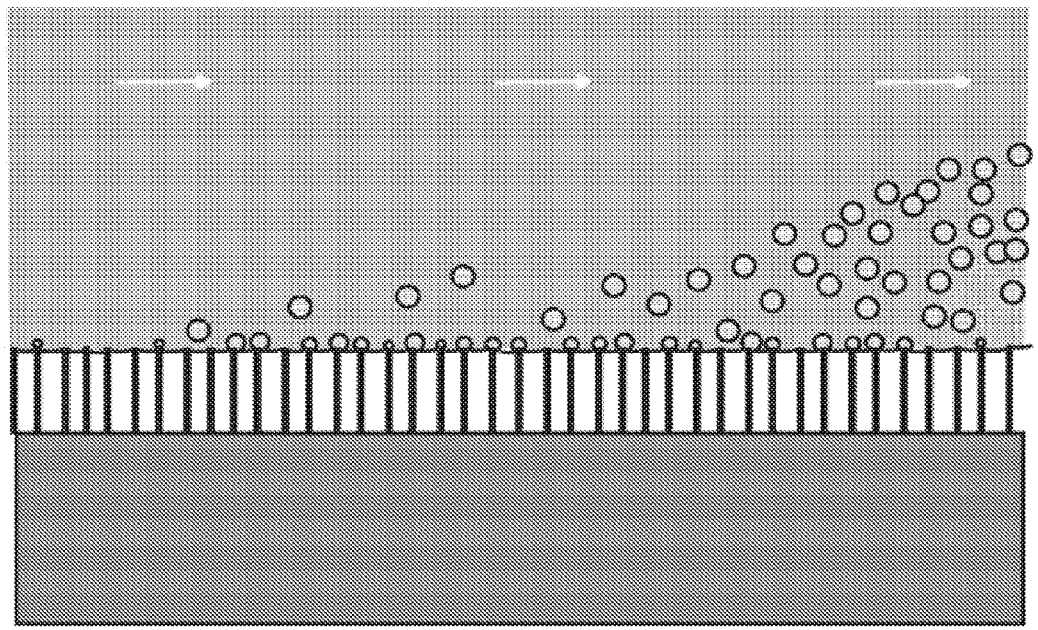

In other embodiments, the particles can be removed in a static system by a surface tension of the propagating drying front of the liquid droplet. As shown in FIG. 7B, as the liquid dries, particles on the edge of the drying front can become detached and can be concentrated in the remaining droplet volume. The particles detached according to this method may tend to form agglomerates of relatively monodisperse particles sizes.

In one embodiment, the method can be used to produce and collect highly uniform nanosized particles. In another embodiment, the deposits can be composed of a "carrier, neutral" material (such as, for example calcium carbonate), but the deposition can take place in the presence of active dopant nanoparticles that would be co-deposited with the carrier material and become embedded into the sphere. In this way, one can produce uniform particles doped with the material of choice, e.g., an active biochemical compound, magnetic particles, etc. and can be used as a delivery system or a catalytic particle.

A further alternative of localized chemical reaction on the tips of a superhydrophobic surface structure could also involve some kind of catalytic reaction, in the liquid phase, without solid precipitation.

Colloidal/Nanoparticle Attachment

In some other embodiments, superhydrophobic surfaces can be utilized to attach any previously formed particles, such as polymer colloids, inorganic colloids, nanoparticles, quantum dots, nanorods, proteins, cells, and the like. For example, superhydrophobic surfaces can be functionalized with desired functional groups that can interact with any desired particles. Some non-limiting exemplary interactions include electrostatic, covalent, hydrogen bonding, and/or van der Waals interactions.

Figure 8:
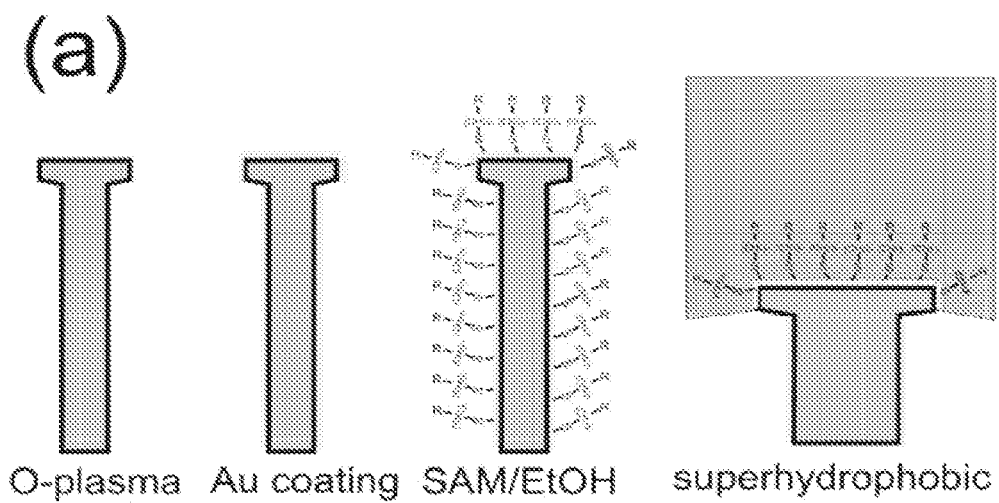
FIG. 8 is a schematic showing attachment of particles onto superhydrophobic surfaces using ionic interactions between negatively charged superhydrophobic surface and positively charged particles.
Figure 8:
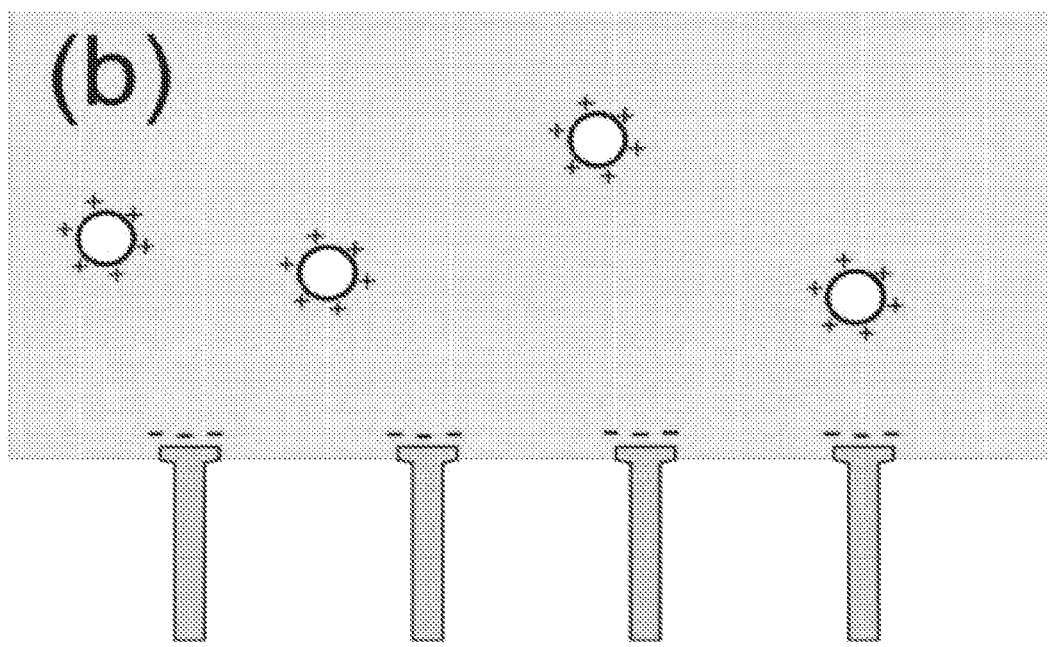

For example, as shown in FIG. 8, functional groups can be applied to superhydrophobic surfaces having raised surface structures with re-entrant structures in the shape of nails. As shown in FIG. 8(a), different processes can be carried out to functionalize the surface of the raised surface structures, such as oxygen plasma, gold coating, and self-assembled monolayer (SAM) attachment. For example, non-water based liquids or liquids having low surface tension (e.g., ethanol) can be utilized as a suitable solvent to introduce thiolated molecules to the nanorods and coat the entire surface of the nanorods with SAM. Such processes are expected to coat along the entire surface of the nanorods; however, the superhydrophobic nature of the structure is expected to prevent complete wetting when later exposed to a growth solution (e.g., a water-based growth solution). Then, as shown in FIG. 8(b), the SAM can be modified to carry any number and type of suitable functionality (e.g., negative charge) through any suitable methods. The negatively charged superhydrophobic surface can then interact with, for example, positively charged particles to form particles attached onto the superhydrophobic surface.

Examples of surface groups that can provide positive charges include amine groups, which could be achieved using alkanethiol self-assembled monolayer (SAM) species such as $HS(CH_2)_{11}NH_3^+Cl^-$, $HS(CH_2)_{11}NMe_3^+Br^-$, or $HS(CH_2)_{11}C(NH_2)_2^+Cl^-$, or from colloidal particles having amine groups, such as polystyrene particles synthesized with amidine surface groups.

Examples of surface groups that can provide negative charges include carboxylic acid (—COOH), phosphate (—$PO_3H_2$), or sulfate (—$SO_3$) which could be achieved using alkanethiol SAMs such as $HS(CH_2)_nCOOH$, $HS(CH_2)_n SO_3H$, or $HS(CH_2)_nPO_3H_2$, or having a silica surface having a multitude of silanol (Si—OH) groups which can become negatively-charged over a range of pH.

Hydrogen bonding can be involved with strongly interacting charged groups such as amine (—$NH_2$) and —OH groups.

An example of attachment by covalent bonding includes the reaction between carboxylic acid (—COOH) with an amine group (—$NH_2$). Such types of covalent bonding reactions are involved in protein binding interactions, which includes DNA hybridization and biotin-streptavidin pairing.

Moreover, electrostatic attraction could also be achieved by applying a potential to a conductive superhydrophobic surface, for the electrophoretic attachment of oppositely-charged particles. For example, the attachment of negatively charged particles (such as $SiO_2$ particles in basic conditions, or polystyrene particles with sulfate groups) onto a post structure with a positive charge from an applied potential.

As noted above, the interaction between the particles and the superhydrophobic surface need not be limited to electrostatic interactions as exemplified above. Other suitable interactions can include any surface chemistries one of ordinary skill in the art would readily recognize.

Polymer and Molecular Adsorption

Attachment to superhydrophobic surfaces need not be limited to particles. In some other embodiments, molecules may be attached to the superhydrophobic surfaces. For example, polymers, proteins, DNA, or other biological and non-biological molecules can be attached to the superhydrophobic surfaces.

Moreover, by controlling the rate at which the fluid containing the desired molecules passes over the superhydrophobic surface, certain morphologies can be formed. For example, the superhydrophobic surfaces can be utilized to form sheets, dendritic fibrous structures, or even to draw out fibers.

The superhydrophobic surfaces can be functionalized with any desired functional groups that can interact with any desired molecules. In certain embodiments, the molecules may simply adsorb onto the superhydrophobic surface.

The deposition of molecules and polymers to the raised surface structures has a number of potential applications. For example, the molecules can be deposited to chemically functionalize the post structure, or to provide a physical or chemical adhesion layer for the further attachment of functional molecules, fluorescent dyes, proteins, or biological cells.

Specifically, the absorption of a polymer such as polyethylene glycol (PEG) may have applications for the resistance of non-specific binding of proteins in biological applications. Or fluorescent dye could be incorporated into a polymer, such as polyvinyl alcohol (PVA), to fluorescently label the raised surface structures. Or the tips can be functionalized with a variety of signaling molecules or proteins, such as collagen, to direct and bias the interaction with cells, their proliferation and differentiation.

Alternatively, a polymer such as PVA could be deposited with a protein, or drug molecule, in solution, so that the protein or drug molecule is physically but not (necessarily) chemically contained within the PVA deposition. As a result, the protein or drug molecule can be immobilized in the polymer deposit. Under appropriate conditions the contained species could be slowly released back into solution as an application for drug release.

Furthermore, the deposition of nanoscale polymer fibers, such as polyvinyl alcohol (PVA), could be used to make nanowire elements of an electrical circuit, as a MEMs device or sensors. PVA fibers could act as a template for the vapor phase growth of inorganic species, such as conductive Au or Ag layers. Alternatively, an electrically-conductive polymer (such as polyaniline) could be deposited into fibers, to make conductive nanowire elements.

Finally, a hydrogel polymer material can be deposited as fibers, or a film structure, onto a suitably-flexible surface structure (such as posts), and a stimulation such as electrical, chemical (ie; pH), or hydration, can be applied to cause the mechanical movement of the post structure as a MEMs device or sensor.

The functionalized surfaces may also act as sensor arrays when appropriately functionalized with molecular, polymeric, or colloidal deposits. For example, an array of nanowires functionalized with various biomolecules, such as peptide nucleic acid probe molecules can form a nanoelectromechanical resonators, which are attractive for chipbased sensor arrays because of their potential for ultra-sensitive mass detection. The resonant frequency of such an excited array may depend on selective surface binding and complementary bound targets can be detected.

Clustering of Adherent Particles

Figure 9:
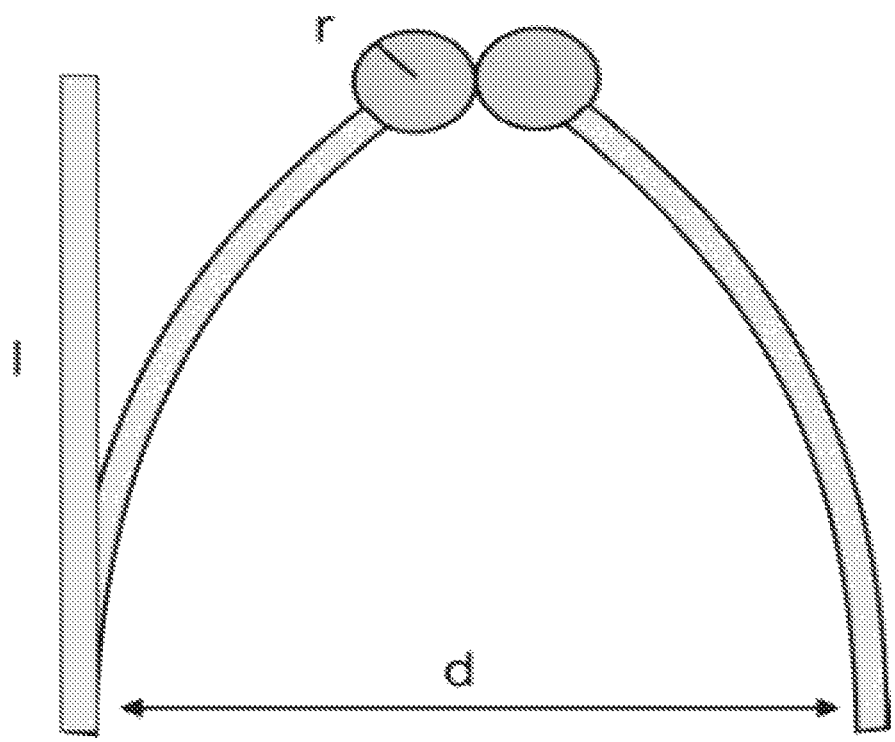
FIG. 9 is a schematic illustration of a spring approximation according to one or more embodiments.

In another aspect, the surface tension of the liquid and the Young's modulus and geometry of the nanowire array can be regulated and balanced in such a way that the force applied by the liquid will induce bending and clustering of the nanowires into groups (see, e.g., FIG. 9). The number and pattern of the grouped nanowires can be controlled by tuning the geometry of the nanowire and the Young's modulus of the nanowire material.

Without wishing to be bound by theory, the spring approximation theory that may explain this process is briefly described. Consider two cylindrical silicon pillars of height L and cross-sectional radius r separated by a distance d at their bases whose tips are bent towards each other by the surface tension of a drop of liquid polymer. Let the displacement of each tip from the vertical be x. Under this deformation, each pillar then acts like a spring with a restoring force $k_x$ acting on the tip in the direction opposite to the displacement. The spring constant k is $$k = \frac{\pi^2 Y r^4}{2L^3}$$

where Y is the Young modulus of silicon. The energy associated with the pair of pillars under displacement is thus $G_p = kx^2$.

The polymer drop has a surface energy due to its surface tension, given by $G_d = \gamma S$ where S is its surface area. In the absence of any other forces, the drop will tend to minimize its surface energy and hence its surface area, i.e. its preferred shape is a sphere. The effect of the pulling force of the pillar tips is to deform the drop by elongating it in the axis of the line connecting the bases of the pillars (the lateral axis), while keeping its volume constant. This deformation gives rise to a restoring force as the surface tension of the drop strives to keep its shape as close to a sphere as possible. Therefore, the surface tension of the deposited material will cause clustering of the surface structure, such as nanoposts.

Alternatively, a mechanism for cluster formation, for structures having deposits on their tips which can act as a glue—where clustering occurs at the moving liquid front. As a liquid interface (ie; of a droplet) is swept across the surface, capillary forces at the receding front can act to bring post structures together such that the post deposits are in contact. Once the front has moved on, there are forces such as capillary forces, hydrogen bonding, van der Waals attraction, electrostatic and covalent bonding, that can act to hold the posts together.

If the capillary forces are considered, to hold the spheres together, the residual liquid on the spheres slowly evaporates, and the deposit holds the pillar tips together in the bent configuration. If, on the other hand, the capillary forces are not sufficient, the cluster breaks apart into smaller clusters or individual unbent pillars. A larger radius of the spherical deposits can support a larger cluster. A critical radii of deposit is required to allow cluster formation.

Based on an understanding of the foregoing, clustering of 2, 3 or 4 or more adherent particles may depend on the aspect ratio of the posts, pitch spacing between posts, diameter of the deposited particles and the surface tension. These clusters will then be glued together by the deposited material and form large number of uniform, self-assembled structures with unique morphologies and shapes that are impossible to make by any other technique. These can be further applied to create unique photonic assemblies.

EXAMPLES

Example 1

Fabrication of Superhydrophobic Surface

A superhydrophobic surface containing nanoposts was fabricated as follows. The superhydrophobic surface has a square array of cylindrical silicon nanoposts etched on a surface of a silicon wafer. The diameter d of each post was 200-500 nm and the height h was 5-10 µm. The pitch (or distance between posts) can vary, for example between about 1-4 µm.

The dots were printed on 200 mm single crystal Si wafers using 248 nm wavelength photolithography and Deep Reaction Ion Etching (DRIE) was used to etch the posts into the Si. A description of the tool, the etch process used, and additional applications can be found in McAuley, S. A.; Ashraf, H.; Atabo, L.; Chambers, A.; Hall, S.; Hopkins, J.; Nicholls, G. J. Phys. D: Appl. Phys. 2001, 34, 2769, which is incorporated herein by reference in its entirety. To create a hydrophobic surface an additional fluorocarbon layer (approximately 20 nm thick) was deposited by plasma assisted chemical vapor deposition using $C_4F_8$ as the precursor. Similar films were shown to have a F:C ratio of 1.55 (from XPS) and a refractive index of 1.37 (from ellipsometry). Further detail on the preparation of nanostructured superhydrophobic surface can be found in Krupenkin, T. N.; Taylor, J. A.; Schneider, T. M.; Yang, S., Langmuir, 2004, 20, 3824-3827 (February, 2004), which is incorporated by reference in its entirety.

Figure 10:
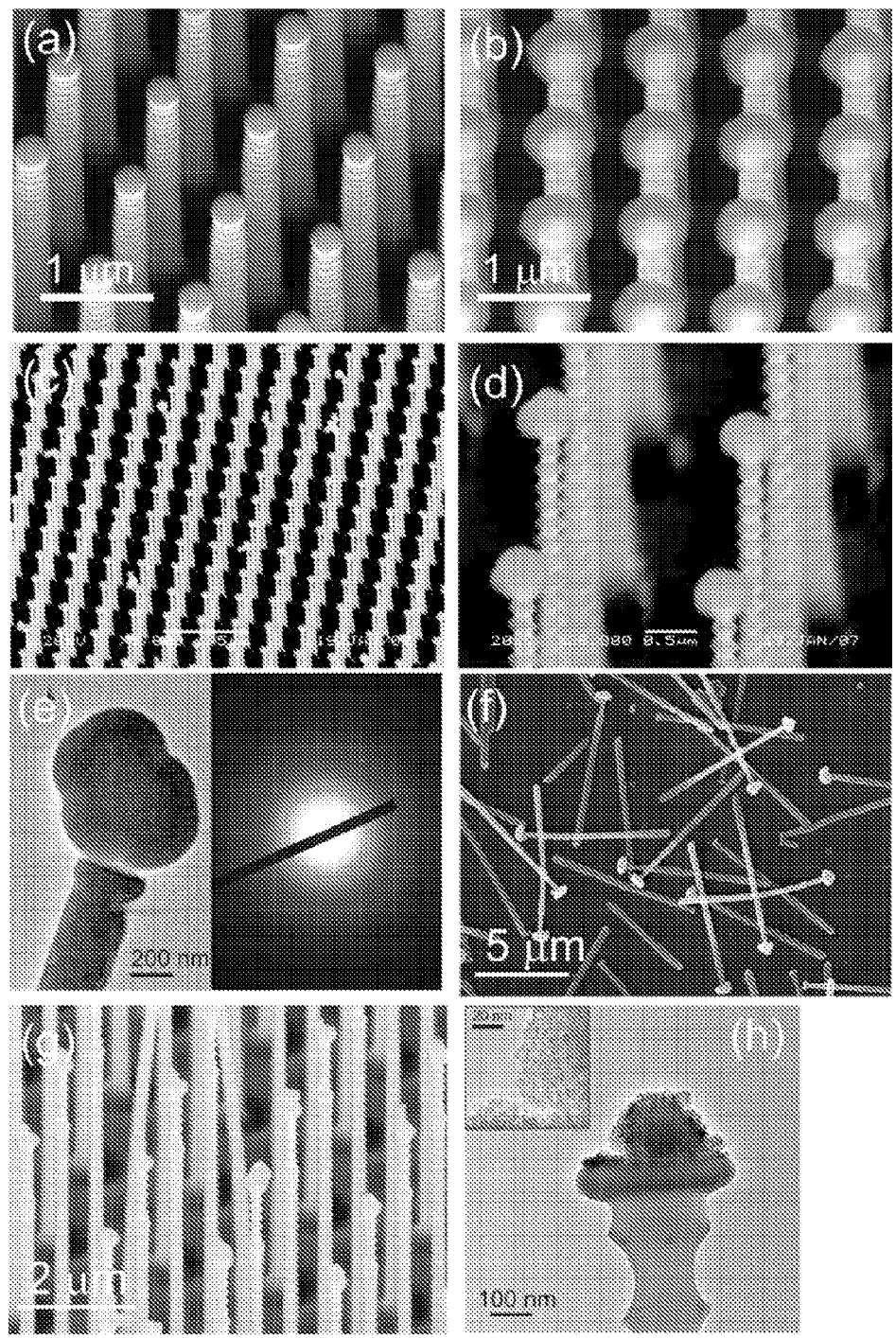
FIG. 10 is a series of photomicrographs at various magnifications showing calcium carbonate and iron oxide deposits on an array of silicon nanowires.

FIG. 10a) shows exemplary silicon posts (1 µm pitch, 300 nm diameter, 5 µm height) having a fluorinated surface coating.

Example 2

Nucleation of $CaCO_3$ Particles

Aqueous solutions of $CaCl_2$ (10 mM, 25 mM and 50 mM) were prepared from $CaCl_2$ (Sigma-Aldrich) in distilled water. Droplets of 30 µL were placed on a superhydrophobic Si nanowire array substrate shown in FIG. 10a).

The non-wetting droplets were exposed to a flow of carbon dioxide gas from a nitrogen gas flow over ammonium carbonate powder (($NH_4)_2CO_3$, Sigma-Aldrich). After about 20 minutes, the droplets were removed from the substrate, and the substrates removed from the chamber. SEM imaging (JEOL-5600LV) was achieved at 20 kV without any additional conductive layer. FIG. 10b) shows formation of an almost monodisperse array $CaCO_3$ particles on top of the Si nanowire posts.

The non-wetting droplets were also enclosed in a closed dessicator chamber containing ammonium carbonate powder (($NH_4)_2CO_3$, Sigma-Aldrich), which decomposes to $CO_2$ and $NH_3$ vapor. The $CO_2$ gas diffuses into the droplets to cause the precipitation of $CaCO_3$, selectively on the tips of the posts. After periods of time ranging from 10-30 minutes, the droplets were removed from the substrate, and the substrates removed from the chamber. SEM imaging (JEOL-5600LV) was achieved at 20 kV without any additional conductive layer. FIGS. 10c) and d) shows formation of an almost monodisperse array $CaCO_3$ particles on top of the Si nanowire posts. (2 µm pitch, 200 nm diameter, 9 µm height).

As shown, the $CaCO_3$ spheres with precisely controlled size ranged between 100 nm to 1 µm were obtained. The spheres were stable and did not detach upon de-wetting.

FIG. 10e) shows the TEM image of a $CaCO_3$ particle deposited on the post tip, showing that it is amorphous. However, one of ordinary skill in the art would readily recognize that crystalline particles can be formed thereon as well.

FIG. 10f) shows how the Si nanoposts with the particles attached thereon can be removed from the substrate. As shown, nanowire heterostructures that have a wide range of material choices can be envisioned.

Example 3

Nucleation of $Fe_3O_4$ Particles

Aqueous solutions of mixed $FeCl_2$ and $FeCl_3$ were prepared and droplets were placed on a superhydrophobic Si nanowire array substrate. The non-wetting droplets were exposed to an atmosphere of $NH_3$ using ammonia solution in a closed chamber. Within minutes, the droplet began to turn black from the precipitation of $Fe_3O_4$. After about 10 minutes, the droplet was removed to leave behind the deposit of $Fe_3O_4$ nanoparticles on top of each post (see FIGS. 10g) and h)).

Example 4

Functionalization of Superhydrophobic Surfaces

Figure 11:
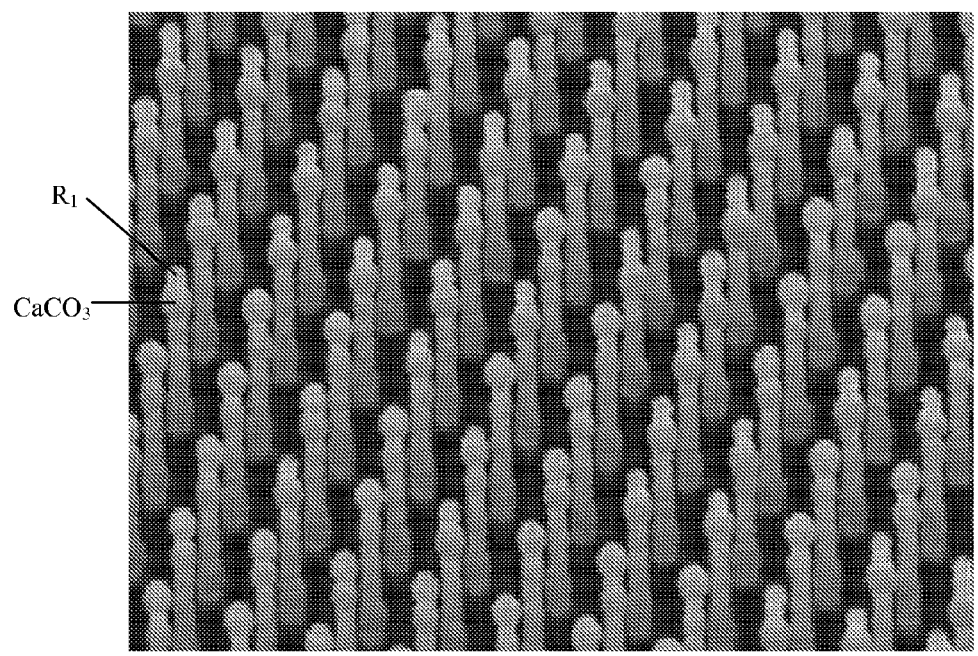
FIG. 11 is a photomicrograph of a silicon nanowire that has been functionalized at a lower region below the tip of the nanopost according to one or more embodiments.

FIG. 11 is a photomicrograph of silicon nanowires that have been functionalized at a lower region (corresponding to $R_2$ in FIG. 2). In this exemplary embodiment, the array of Si nanostructures was first coated with a 30 nm layer of gold, then covered with a polymer. Some suitable polymers that can be utilized include polymethyl methacrylate (PMMA), polystyrene (PS), or standard photoresist material, such as Shipley 1400-17. The polymer layer was etched away by reactive ion etching to reveal the tips that were functionalized with a hydrophobic thiol (corresponding to $R_1$ in FIG. 2). After that, the next band of about 1-2 microns was revealed by further etching of the sacrificial polymer. This band was functionalized with carboxylic acid-terminated thiol [(HS—$(CH_2)_{15}$—COOH] (corresponding to $R_2$ in FIG. 2). Then the rest of the sacrificial layer was removed and the nanowires were functionalized with a hydrophobic thiol. The upper layer (corresponding to $R_1$ in FIG. 2) does not serve as a heteronucleation site for the deposition of material. When a solution of calcium chloride is brought into contact with the nanostructures in a $CO_2$ atmosphere, the solution wets the surface of layer $R_2$ and deposits an amount of $CaCO_3$. The upper layer, however, remains substantially clean and free of $CaCO_3$ deposition.

Example 5

Precipitate Writing of a $CaCO_3$ Pattern

Figure 12:
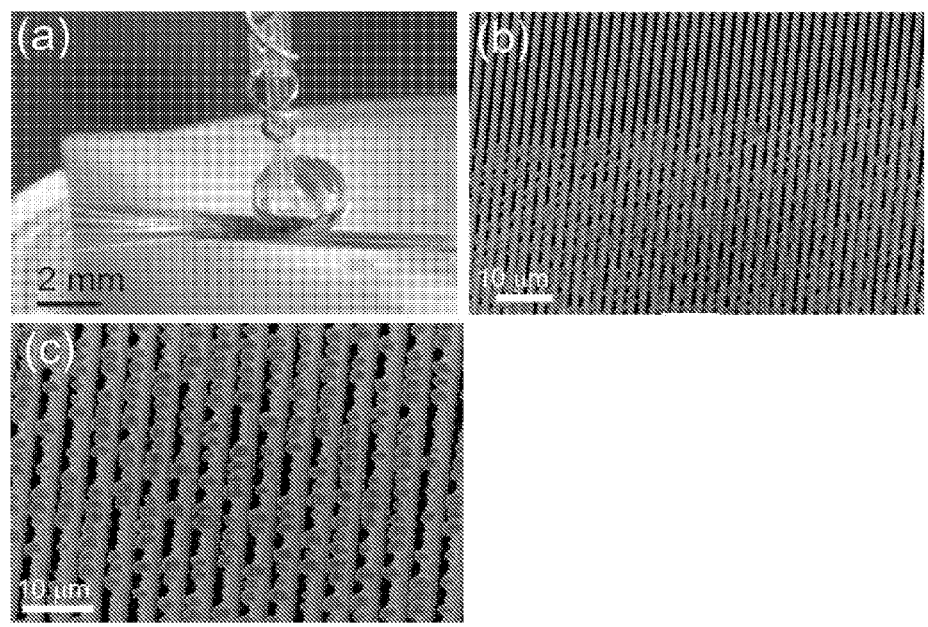
FIG. 12 is a photomicrograph of (a) a growth solution droplet moving on a Si nanowire array surface, (b) and (c) adherent $CaCO_3$ precipitates shown at different magnifications from a droplet translated along the substrate.

The grown solution and superhydrophobic Si surface are prepared as described above for Example 2. A syringe pump and PTFE (Teflon) micro-tubing were used to deliver the $CaCl_2$ droplet to the surface of the nanowire array substrate, positioned on a translation stage (see FIG. 12(a)). The substrate was moved at a rate of 1 mm/min during the exposure within a chamber of ammonium carbonate substantially as described in Example 2. $CaCO_3$ precipitates were deposited from a droplet of 100 mM $CaCl_2$ solution onto the substrate during deposition (see FIG. 12(b)). FIG. 12(c) shows examples of $CaCO_3$ deposits from a droplet of $CaCl_2$ solution which was translated across the substrate during deposition.

Example 6

Figure 13:
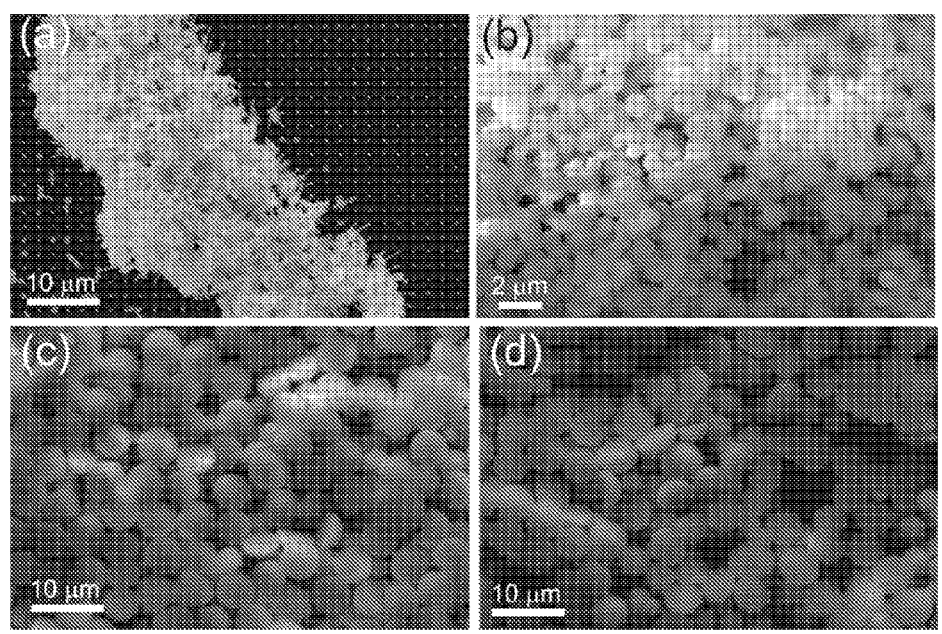
FIG. 13 is a photomicrograph of non-adherent $CaCO_3$ precipitates grown on a superhydrophobic Si nanowire according to one or more embodiments.

Preparation of Non-Adherent Particles $CaCO_3$ was deposited on Si nanoposts according to the method described for Example 2, except that a longer growth period on a hydrophobic nanowire array substrate was used that caused the growth of larger deposits. Due to the combination of the hydrophobic surface, the smooth shape of the Si post, and the large deposit size, the precipitates became detached from the posts following growth. At the edges of the droplet contact area, agglomerates of spherical and hemispherical $CaCO_3$ precipitates were found. FIG. 13 shows an example of $CaCO_3$ precipitates from solution which became detached from the Si posts and agglomerated together.

Example 7

Attachment of Colloids/Nanoparticles

Figure 14:
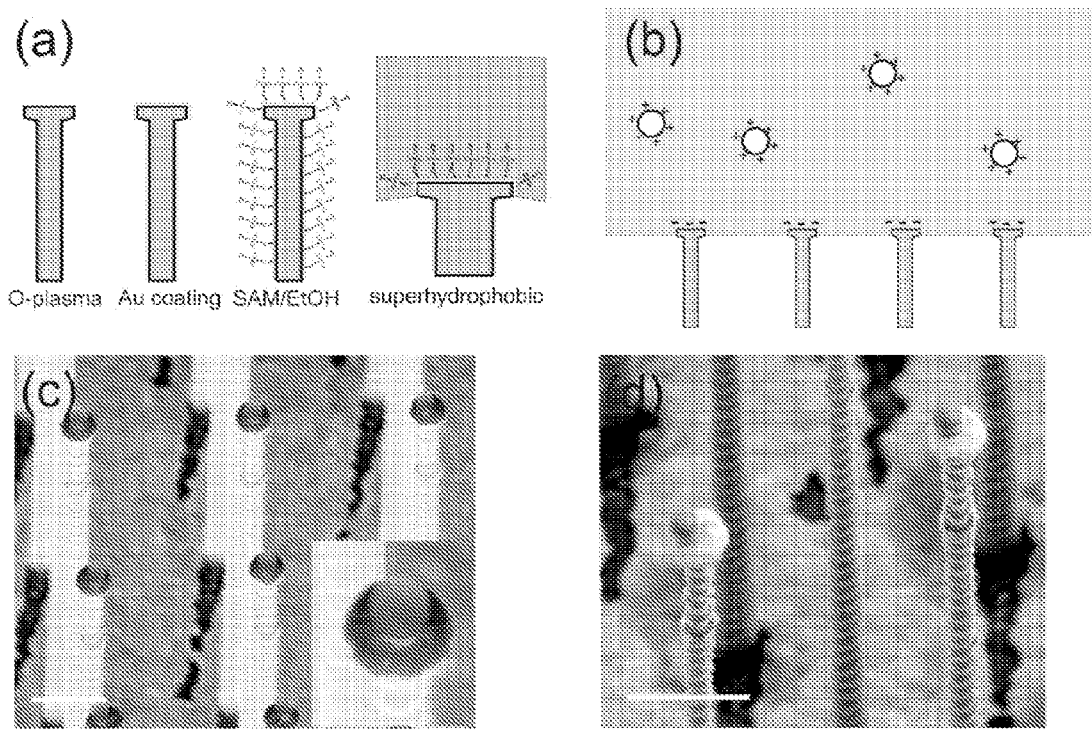
FIG. 14 is a schematic and photomicrograph showing attachment of particles onto superhydrophobic surfaces using ionic interactions between Si nanoposts with a negatively-charged surface group and positively-charged particles.

FIG. 14(a) shows schematically the experimental method to put surface functional groups onto the posts. The surface structure was first cleaned using oxygen plasma, then sputter-coated with Au (or e-beam evaporation). The whole post structure was exposed to a solution of COOH-terminated alkanethiol (ie; 1 mM in ethanol, $HOOC-C_{15}-SH$) for 30 min, so that the self-assembled monolayer (SAM) was allowed to go everywhere around the post. The nail-shaped posts can interact superhydrophobically with an aqueous liquid even if there is a charged surface group present on the surface (in this case, COOH groups).

FIG. 14(b) shows schematically that a colloidal suspension of particles (ie; polymer or inorganic colloids, nanoparticles, quantum dots, etc) which has a surface charge could be attracted to the oppositely-charged post tips. This attachment could be covalent (e.g., biotin-avidin) as well as electrostatic.

FIGS. 14(c) and (d) show SEM examples of 200 nm diameter polystyrene (PS) spheres, having a positively-charged surface of amidine groups, interacting with the negatively-charged, COOH-functionalized post structures. A 5 wt % suspension of particles was dragged over the surface of the non-wetting substrate, as a droplet, and a trail of particles was left behind (as shown). If negatively-charged particles were used, nothing was left behind, which demonstrates that it is an electrostatic effect.

Example 8

Deposition of Polymers from Solution

A droplet of 4 wt % polyvinyl alcohol (PVA) solution in water, which also contained rhodamine B fluorescent dye was applied onto a superhydrophobic post structure substrate (2 µm post spacing, 300 nm diameter, 5 µm tall, fluorinated surface).

Figure 15:
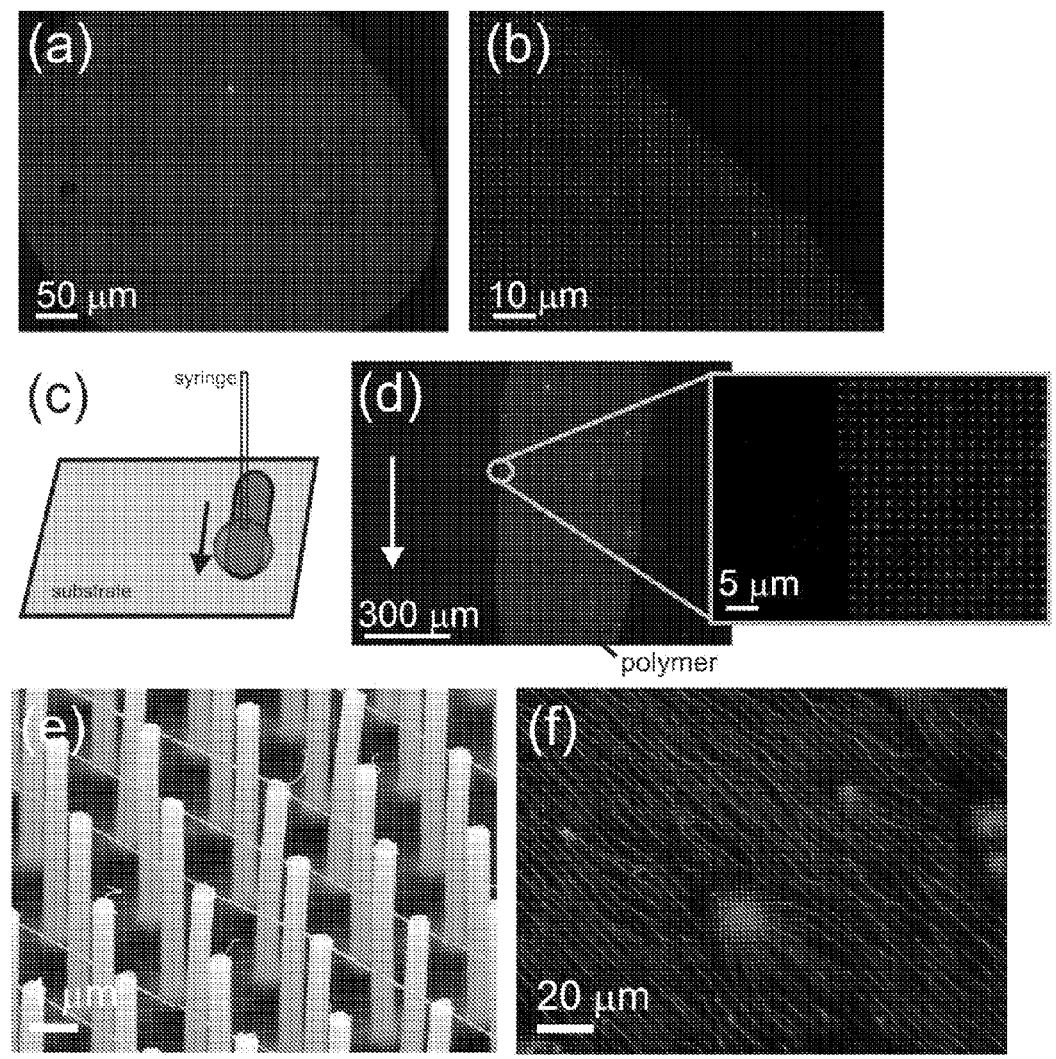
FIG. 15 is a schematic and photomicrograph showing adsorption of polyvinyl alcohol (PVA) onto a superhydrophobic Si nanorod surface under static and dynamic conditions.

FIG. 15(a) shows the 'footprint' of a 3 mm diameter droplet, after touching the surface for 2 s and being withdrawn.

FIG. 15(b) shows a higher magnification image of the individual posts of FIG. 15(a), showing a clear boundary between the printed and non-printed areas.

FIG. 15(c) shows the results for slowly dragging (translating) a similarly-sized droplet of PVA solution across the substrate (at a rate of 0.5 mm/second), to leave behind a trail of polymer deposit.

FIG. 15(d), (e), and (f) show the results of rapidly translating (ie; 10 mm/s) the same droplet from FIG. 15(c). As shown, instead of discrete deposits on each post, a trail of fibers is produced, to link individual posts together. In this case, the PVA fibers are around 50 nm in diameter, and roughly correspond to the direction of droplet translation.

Example 9

Deposition of Biomolecule from Solution

Figure 16:
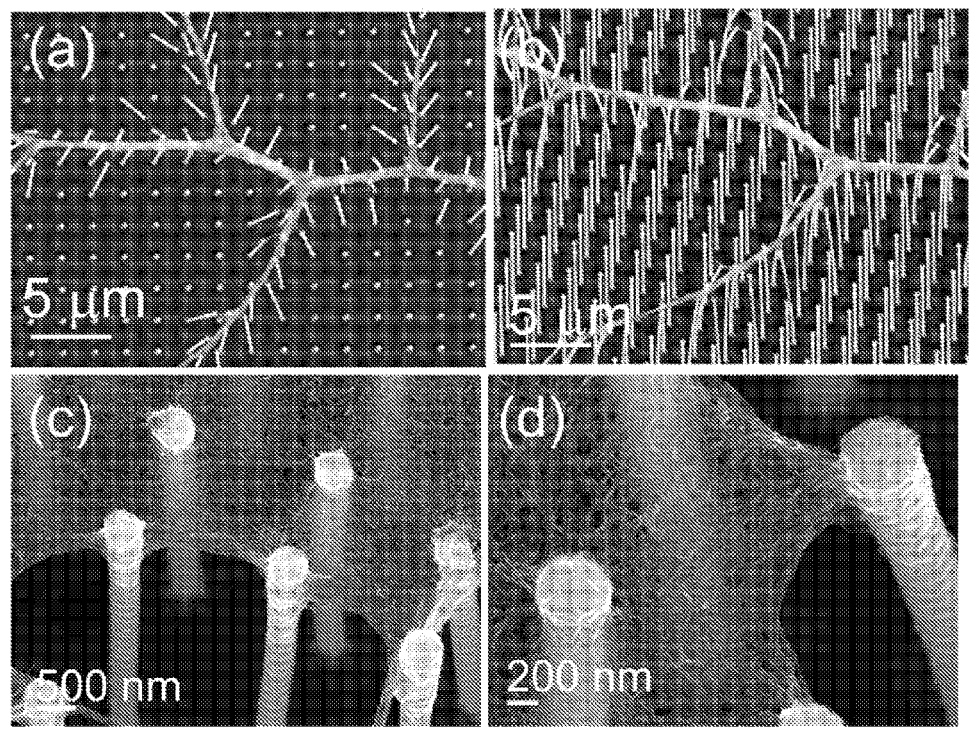
FIG. 16 are photomicrographs showing adsorption of collagen protein and carbon nanotubes onto the superhydrophobic surface.

As shown in FIGS. 16(a) and (b), collagen (type 1 collagen, in aqueous solution) was dragged over a post structure substrate (fluorinated surface), to leave behind a dendritic fibrous structure on the tops of the posts.

Example 10

Deposition of Carbon Nanotubes from Solution

In FIGS. 16(c) and (d), a solution of carbon nanotubes (in aqueous solution, COOH-fuctionalized, 10% solution), was used to deposit an interconnected film (and individual fiber strands) on the tops of the posts.

Example 11

Clustering of Adherent Structures

Figure 17:
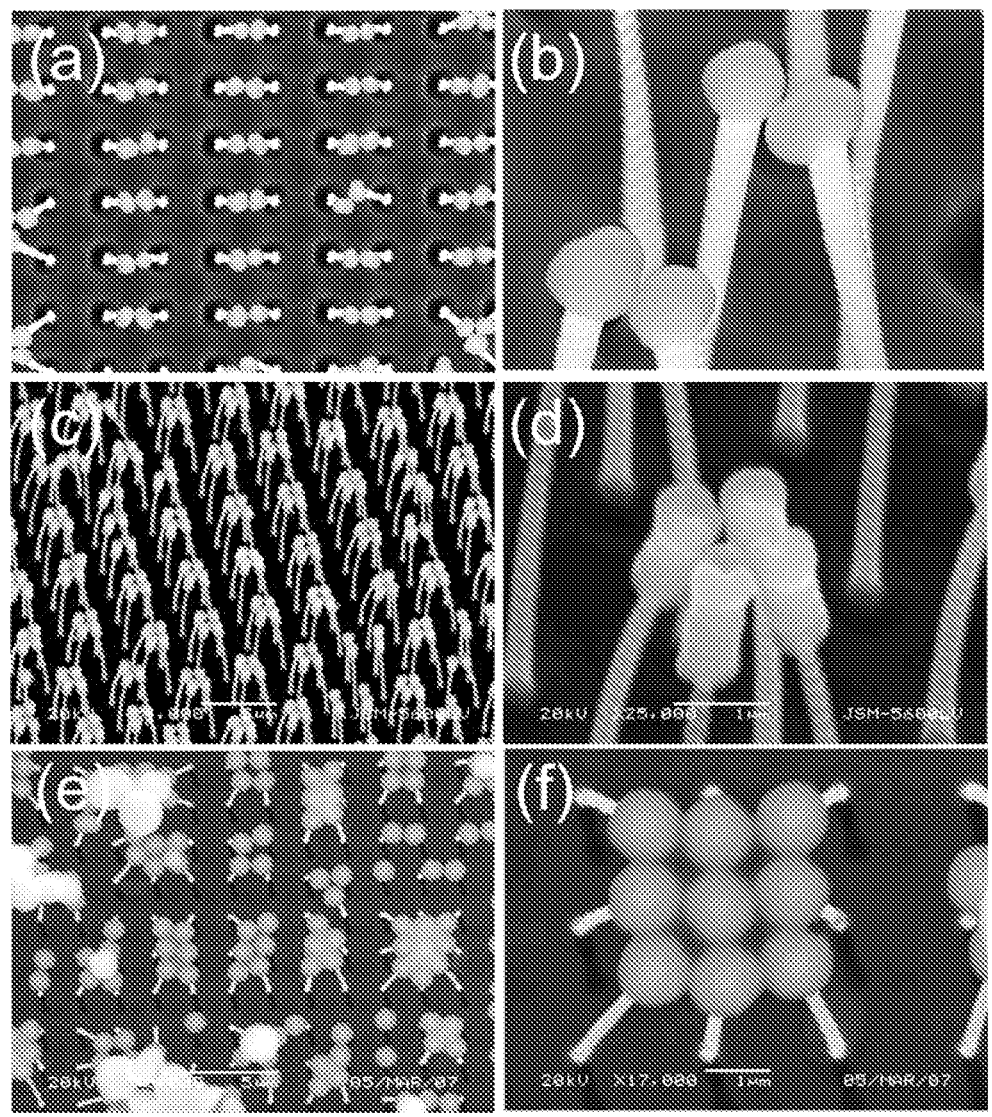
FIG. 17 are photomicrographs of Si nanorods with adherent $CaCO_3$ deposits that have formed clusters, according to one or more embodiments.

FIG. 17 is a photomicrograph series of dimers and higher order clusters that have assembled into an almost perfect array. If the surface tension of an applied liquid is sufficient to bend the nanowires, then the wires can cluster at the tips. The deposited particles of $CaCO_3$ can form dimers (FIGS. 17(a) and (b)), tetramers (FIGS. 17(c) and (d)), or higher orders (FIGS. 17(e) and (f)) as they dry. The structures can be fixed by using the deposited material residual in the liquid as an interparticle glue.

Figure 18:
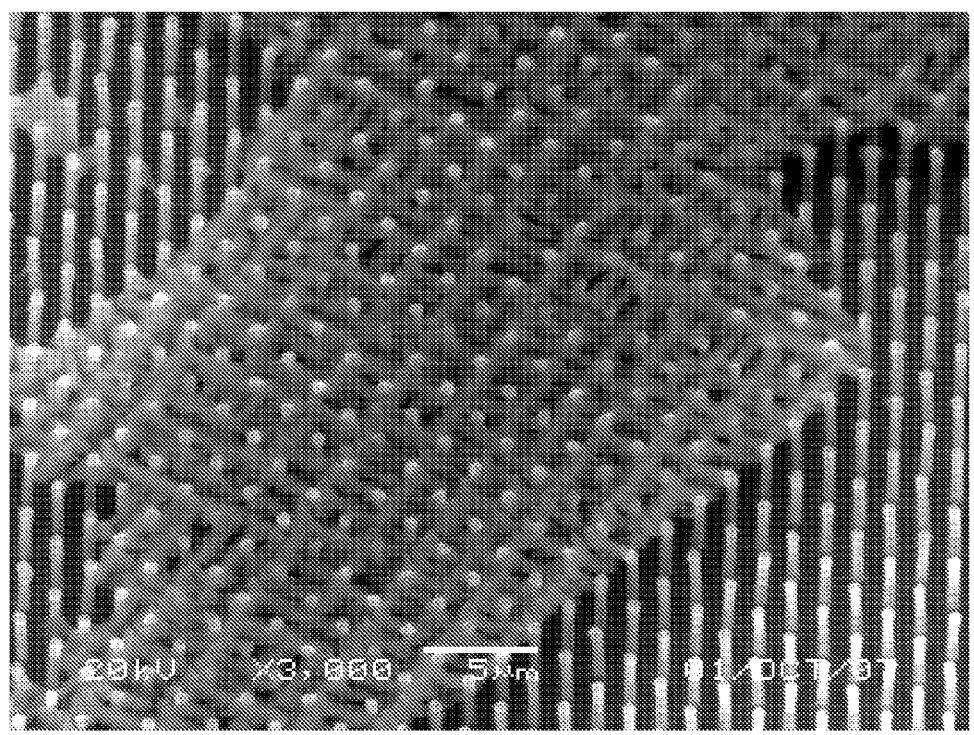
FIG. 18 is a photomicrograph of a $CaCO_3$ fibrous precipitate grown between posts.

In some embodiments, the stretching of the water droplet at the nanowire surface will also lead to "woven" deposits connecting the nanowires without significant bending, in the case of stiff wires (FIG. 18).

Although various embodiments that incorporate the teachings of the present invention have been shown and described in detail herein, those skilled in the art can readily devise many other varied embodiments that incorporate these teachings, including embodiments with numerical values and ranges differing from those set forth herein. It is appreciated that the figures and discussion herein illustrate only an exemplary device and method. Thus, the present invention is not limited to only those structures and methods described herein. The process described above is not restricted to any particular order. The features of various embodiments may be combined with each other. Also, other processes not mentioned above may be included that are consistent with the stated objectives of the invention.

What is claimed is:

1. A method of localized formation of a material, comprising:
    contacting a superhydrophobic substrate comprising raised surface structures with a non-wetting aqueous fluid comprising a material to be locally formed on the raised surface structure or a precursor of the material to be locally formed, said superhydrophobic substrate and said fluid selected such that the non-wetting aqueous fluid wets only an upper portion of the raised surface structure; and allowing the material to form on the upper portion of the raised surface structure.

2. The method of claim 1, wherein the raised surface structure comprises microscale or nano-scale posts or rods.

3. The method of claim 2, wherein the superhydrophobic surface comprises a plurality of nanowires, carbon nanotubes, or combinations thereof.

4. The method of claim 2, wherein the superhydrophobic surface comprises an array of silicon posts.

5. The method of claim 1, wherein the raised surface structure comprises organic materials or inorganic material, or combinations thereof.

6. The method of claim 1, wherein the raised surface structures comprise a random array of raised surface structures.

7. The method of claim 1, wherein the raised surface structure comprises a plurality of posts having the shape of a nail head.

8. The method of claim 1, wherein the raised surface structure is treated to include a hydrophobic layer.

9. The method of claim 1, wherein the raised surface structure is treated to provide bonding or adherent interaction of the material formed on the raised surface structure with the raised surface structure.

10. The method of claim 9, wherein the bonding or adherent interaction is van der Waals interaction, covalent interaction, ionic interaction, hydrogen bonding, or combinations thereof.

11. The method of claim 1, further comprising removing the raised surface structure and the materials formed on the raised surface structure from the substrate.

12. The method of claim 1, wherein the material comprises molecules, polymers, colloidal particles, biological cells, or mixtures thereof.

13. The method of claim 1, wherein the material is catalytic, magnetic, optically active, piezoelectric or bioactive.

14. The method of claim 1, further comprising moving the non-wetting fluid across the raised surface structure.

15. The method of claim 14, wherein the material formed on the raised surface structure detaches from the raised surface structure as the fluid moves across the raised surface structure.

16. The method of claim 1, wherein the material formed on the raised surface structure comprises a molecule that forms a fiber across at least two or the raised surface structures.

* * * * *